United States Patent
Song et al.

(10) Patent No.: US 10,181,498 B2
(45) Date of Patent: Jan. 15, 2019

(54) ORGANIC LIGHT EMITTING DEVICE

(71) Applicant: SAMSUNG DISPLAY CO., LTD., Yongin-si, Gyeonggi-do (KR)

(72) Inventors: Aree Song, Yongin-si (KR); Byeong-hee Won, Yongin-si (KR); Wonsang Park, Yongin-si (KR); Jongin Baek, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/986,450

(22) Filed: May 22, 2018

(65) Prior Publication Data

US 2018/0277611 A1    Sep. 27, 2018

Related U.S. Application Data

(62) Division of application No. 15/250,959, filed on Aug. 30, 2016, now Pat. No. 10,002,912.

(30) Foreign Application Priority Data

Sep. 22, 2015 (KR) ................ 10-2015-0134064

(51) Int. Cl.
*H01L 51/52* (2006.01)
*H01L 27/32* (2006.01)
*H01L 51/50* (2006.01)

(52) U.S. Cl.
CPC ........ *H01L 27/3213* (2013.01); *H01L 51/504* (2013.01); *H01L 27/3218* (2013.01); *H01L 51/5265* (2013.01)

(58) Field of Classification Search
CPC ............ H01L 27/3213; H01L 27/3218; H01L 51/504; H01L 51/5265
See application file for complete search history.

(56) References Cited

U.S. PATENT DOCUMENTS

| 8,040,055 B2 | 10/2011 | Koo et al. |
| 2009/0026943 A1 | 1/2009 | Yuki |
| 2009/0102352 A1 | 4/2009 | Cok et al. |
| 2013/0043498 A1 | 2/2013 | Pyo et al. |

FOREIGN PATENT DOCUMENTS

| KR | 10-2015-0093900 A | 8/2015 |
| KR | 10-2016-0086012 A | 7/2016 |

*Primary Examiner* — Douglas Menz
(74) *Attorney, Agent, or Firm* — Lee & Morse, P.C.

(57) ABSTRACT

An organic light emitting device includes four sub-organic light emitting devices. The first device includes a first anode, a first common light emitting portion, and a first sub-light emitting portion. The second device includes a second anode, a second common light emitting portion, a first auxiliary layer, and a second sub-light emitting portion. The third device includes a third anode and a third common light emitting portion. The fourth device includes a fourth anode, a fourth common light emitting portion, and a light emitting layer emitting a first light. The first and second sub-light emitting portions have an integral structure and emit second light. The first, second, third, and fourth common light emitting portions have an integral structure and emit third light having a wavelength longer than a wavelength of at least one of the first or second lights.

7 Claims, 17 Drawing Sheets

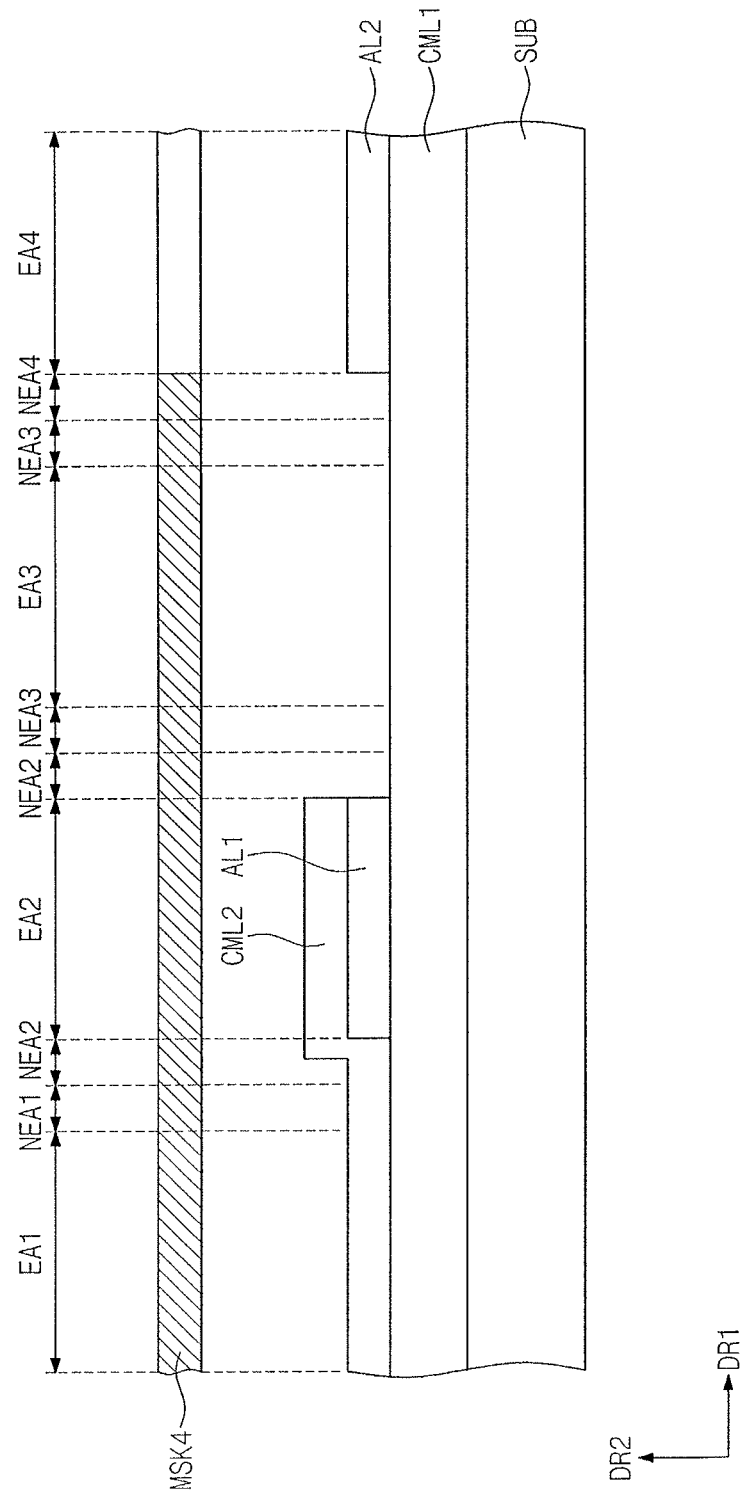

ORGANIC LIGHT EMITTING DEVICE

CROSS-REFERENCE TO RELATED APPLICATIONS

This is a divisional application based on pending application Ser. No. 15/250,959, filed Aug. 30, 2016, the entire contents of which is hereby incorporated by reference.

Korean Patent Application No. 10-2015-0134064, filed on Sep. 22, 2015, and entitled "Organic Light Emitting Device, Display Device Having the Same, and Method of Manufacturing Display Device," is incorporated by reference herein in its entirety.

BACKGROUND

1. Field

One or more embodiments described herein relate to an organic light emitting device, a display device having an organic light emitting device, and a method of manufacturing an display device.

2. Description of the Related Art

A variety of flat display devices have been developed. Examples include flat cathode ray tube devices, plasma display panels, and organic light emitting displays. An organic light emitting display is a self-emissive type of display having a wide viewing angle, superior contrast, and fast response speed. Accordingly, organic light emitting displays are often used in digital cameras, video cameras, camcorders, mobile information terminals, smart phones, tablet personal computers, flexible display devices, and other mobile devices. These displays are also used ultra-thin televisions, appliances, and other larger size electronics applications.

SUMMARY

In accordance with one or more embodiments, an organic light emitting device includes a first sub-organic light emitting device including a first anode, a first common light emitting portion, and a first sub-light emitting portion; a second sub-organic light emitting device including a second anode, a second common light emitting portion, a first auxiliary layer, and a second sub-light emitting portion; a third sub-organic light emitting device including a third anode and a third common light emitting portion; and a fourth sub-organic light emitting device including a fourth anode, a fourth common light emitting portion, and a light emitting layer emitting a first light. The first sub-light emitting portion and the second sub-light emitting portion are provided as an integral structure and emit a second light. The first common light emitting portion, the second common light emitting portion, the third common light emitting portion and fourth common light emitting portion are provided as a integral structure and emit a third light having a wavelength longer than a wavelength of at least one of the first or second lights.

The first light may be in a wavelength range of about 620 nm to about 750 nm, the second light may be in a wavelength range of about 440 nm to about 490 nm, and the third light may be in a wavelength range of about 495 nm to about 570 nm.

The first sub-light emitting device may emit light in a wavelength range of about 440 nm to about 458 nm, the second sub-light emitting device may emit light in a wavelength range of about 459 nm to about 490 nm, the third sub-light emitting device may emit light in a wavelength range of about 495 nm to about 570 nm, and the fourth sub-light emitting device may emit light in a wavelength range of about 620 nm to about 750 nm.

The first auxiliary layer may be between the second common light emitting portion and the second sub-light emitting portion or on the second sub-light emitting portion. The fourth sub-organic light emitting device may include a second auxiliary layer, and the second auxiliary layer may be between the fourth common light emitting portion and the light emitting layer or on the light emitting layer.

The first sub-organic light emitting device may include a first intermediate auxiliary portion between the first common light emitting portion and the first sub-light emitting portion, the second sub-organic light emitting device may include a second intermediate auxiliary portion between the second common light emitting portion and the first auxiliary layer, and the first intermediate auxiliary portion may be provided with the second intermediate auxiliary portion in an integral structure. The first sub-organic light emitting device, the second sub-organic light emitting device, and the third sub-organic light emitting device may be spaced apart from each other.

In accordance with one or more other embodiments, a display device includes a base substrate including a first light emitting area, a second light emitting area, a third light emitting area, and a fourth light emitting area which are spaced apart from each other; a first common light emitting layer in the first light emitting area, the second light emitting area, the third light emitting area, and the fourth light emitting area and provided as a single structure; a second common light emitting layer in the first light emitting area and the second light emitting area, provided on the first common light emitting layer, and provided as a single structure; a first auxiliary layer in the second light emitting area and between the first common light emitting layer and the second common light emitting layer or on the second common light emitting layer; and a light emitting layer in the fourth light emitting area and on the first common light emitting layer to emit a first light, wherein the second common light emitting layer emits a second light and wherein the first common light emitting layer emits a third light having a wavelength longer than a wavelength of at least one of the first or second lights. The first common light emitting layer may be on substantially an entire surface of the base substrate.

The first light may be in a wavelength range of about 620 nm to about 750 nm, the second light may be in a wavelength range of about 440 nm to about 490 nm, and the third light may be in a wavelength range of about 495 nm to about 570 nm.

The first light emitting area may emit light in a wavelength range of about 440 nm to about 458 nm, the second light emitting portion may emit light in a wavelength range of about 459 nm to about 490 nm, the third light emitting portion may emit light in a wavelength range of about 495 nm to about 570 nm, and the fourth light emitting portion may emit light in a wavelength range of about 620 nm to about 750 nm.

The display device may include a second auxiliary layer in the fourth light emitting area and between the fourth common light emitting portion and the light emitting layer or on the light emitting layer. The display device may include an intermediate layer in the first light emitting area and the second light emitting area, between the first common light emitting layer and the second common light emitting layer or on the second common light emitting layer, and provided as a single structure.

The display device may include a hole transport region in the first light emitting area, the second light emitting area, the third light emitting area, and the fourth light emitting area, between the base substrate and the first common light emitting layer, and provided as a single structure. The hole transport region may include a hole injection layer on the base substrate, and a hole transport layer on the hole injection layer, wherein at least a portion of the hole transport layer includes a p-type dopant.

The display device may include an electron transport region in the first light emitting area, the second light emitting area, the third light emitting area, and the fourth light emitting area, provided on the first common light emitting layer, the second common light emitting layer, and the light emitting layer, and provided as a single structure. The electron transport region may include an electron transport layer on the first common light emitting layer, the second common light emitting layer, and the light emitting layer; and an electron injection layer on the electron transport layer.

In a first mode, light may be emitted from each of the first, second, third, and fourth light emitting areas; in a second mode, light may be emitted from each of the first, third, and fourth light emitting areas and is not emitted from the second light emitting area; and in a third mode, light may be emitted from each of the second, third, and fourth light emitting areas and is not emitted from the first light emitting area.

In accordance with one or more other embodiments, a method of manufacturing a display device includes providing a first common light emitting layer on a substrate including a first light emitting area, a second light emitting area, a third light emitting area, and a fourth light emitting area, the first common light emitting layer in the first light emitting area, the second light emitting area, the third light emitting area, and the fourth light emitting area; providing a first auxiliary layer on the first common light emitting layer using a first mask, the first auxiliary layer in the second light emitting area; providing a second common light emitting layer on the first common light emitting layer and the first auxiliary layer or between the first common light emitting layer and the first auxiliary layer using a second mask, the second common light emitting layer is in the first light emitting area and the second light emitting area; and providing a light emitting layer on the first common light emitting layer using a third mask, the light emitting layer is in the fourth light emitting area.

The method may include providing a second auxiliary layer between the first common light emitting layer and the light emitting layer or on the light emitting layer using a fourth mask, the second auxiliary layer in the fourth light emitting area. Each of the first mask, the second mask, and the third mask may be a fine metal mask.

BRIEF DESCRIPTION OF THE DRAWINGS

Features will become apparent to those of skill in the art by describing in detail exemplary embodiments with reference to the attached drawings in which:

FIGS. 9A to 9F illustrate stages of manufacture in the method of FIG. 8.

DETAILED DESCRIPTION

Figure 1:
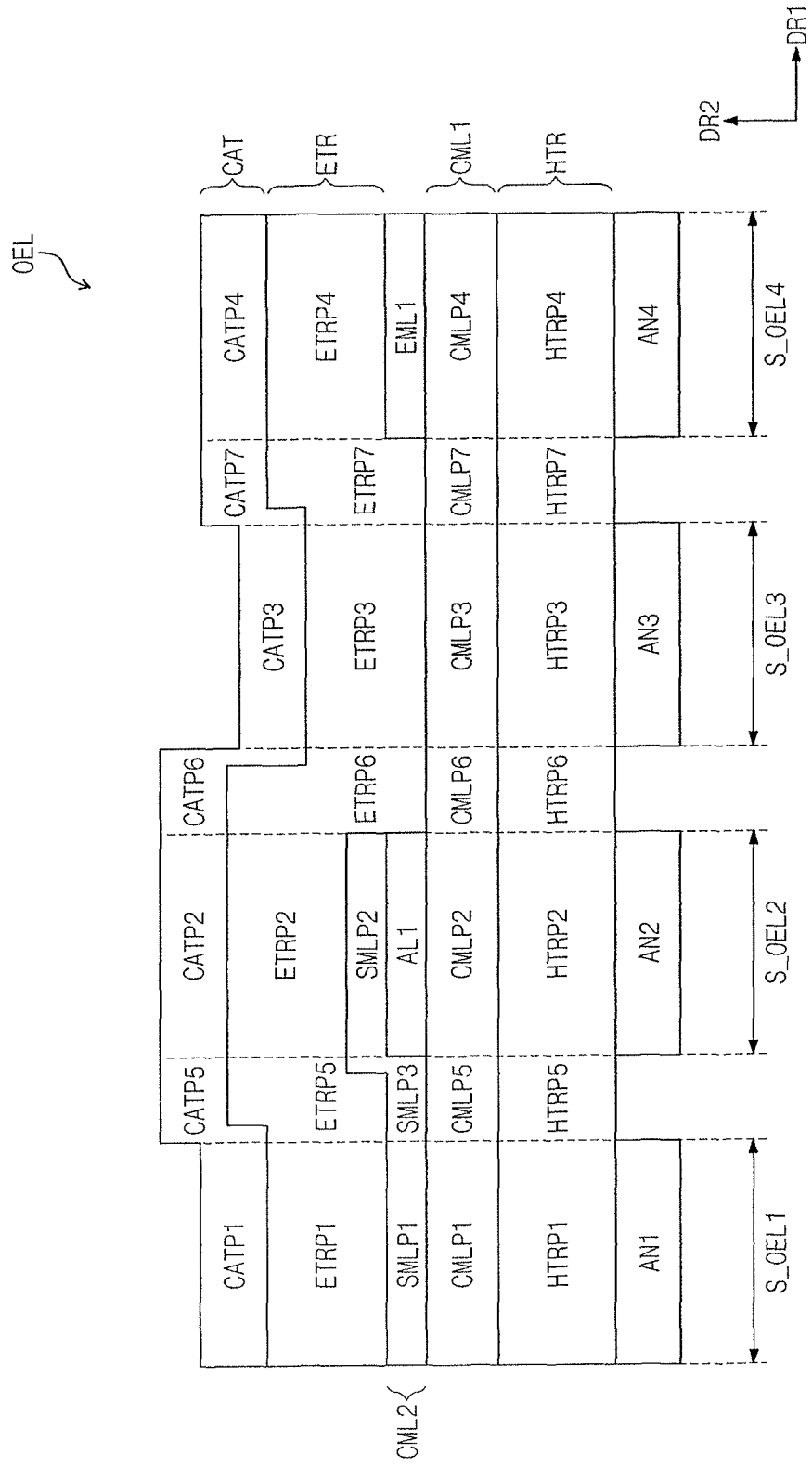
FIG. 1 illustrates an embodiment of an organic light emitting device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Figure 2:
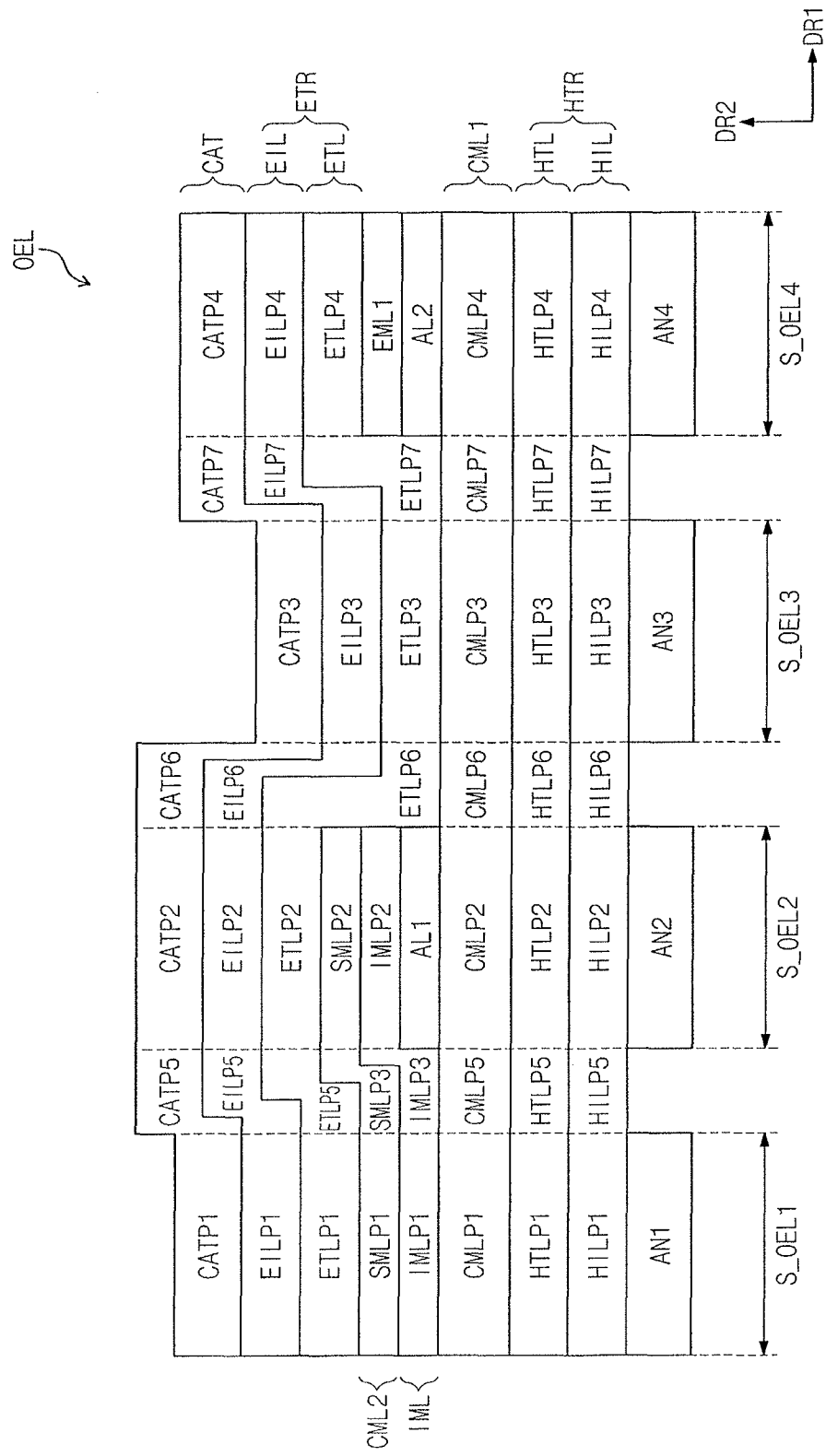
FIG. 2 illustrates an embodiment of an organic light emitting device.

FIG. 1 is a cross-sectional view illustrating various embodiments of an organic light emitting device OEL. Referring to FIGS. 1 and 2, the organic light emitting device OEL includes a first sub-organic light emitting device S_OEL1, a second sub-organic light emitting device S_OEL2, a third sub-organic light emitting device S_OEL3, and a fourth sub-organic light emitting device S_OEL4 spaced apart from each other.

The first sub-organic light emitting device S_OEL1 emits light in a wavelength range of about 440 nm to about 458 nm. Thus, the first sub-organic light emitting device S_OEL1 may emit deep blue light. The first sub-organic light emitting device S_OEL1 may control a resonance distance to emit light in the wavelength range of about 440 nm to about 458 nm. The first sub-organic light emitting device S_OEL1 includes a first anode AN1, a first common light emitting portion CMLP1, a first sub-light emitting portion SMLP1, and a first cathode portion CATP1 may be sequentially stacked in a second direction DR2 crossing a first direction DR1.

The second sub-organic light emitting device S_OEL2 emits light in the wavelength range of about 459 nm to about 490 nm. Thus, the second sub-organic light emitting device S_OEL2 may emit sky blue light. The second sub-organic light emitting device S_OEL2 may control a resonance distance to emit light in the wavelength range of about 459 nm to about 490 nm. The second sub-organic light emitting device S_OEL2 includes a second anode AN2, a second common light emitting portion CMLP2, a first auxiliary layer AL1, a second sub-light emitting portion SMLP2, and a second cathode portion CATP2 stacked in the second direction DR2. In one embodiment, the second anode AN2, the second common light emitting portion CMLP2, the second sub-light emitting portion SMLP2, the first auxiliary layer AL1, and the second cathode portion CATP2 may be sequentially stacked in the second direction DR2.

In one embodiment, the first sub-light emitting portion SMLP1 of the first sub-organic light emitting device S_OEL1 and the second sub-light emitting portion SMLP2 of the second sub-organic light emitting device S_OEL2 include the same material. The resonance distance of the first sub-organic light emitting device S_OEL1 and the resonance distance of the second sub-organic light emitting device S_OEL2 may be controlled to be different from each other, since the first sub-organic light emitting device S_OEL1 does not include the first auxiliary layer AL1 and the second sub-organic light emitting device S_OEL2 includes the first auxiliary layer AL1. Accordingly, the first sub-organic light emitting device S_OEL1 may emit light in the wavelength range of about 440 nm to about 458 nm and the second sub-organic light emitting device S_OEL2 may emit light in the wavelength range of about 459 nm to about 490 nm.

The third sub-organic light emitting device S_OEL3 emits light in the wavelength range of about 495 nm to about 570 nm. Thus, the third sub-organic light emitting device S_OEL3 may emit green light. The third sub-organic light emitting device S_OEL3 may control a resonance distance to emit light in the wavelength range of about 495 nm to about 570 nm. The third sub-organic light emitting device S_OEL3 includes a third anode AN3, a third common light emitting portion CMLP3, and a third cathode portion CATP3 sequentially stacked in the second direction DR2.

The fourth sub-organic light emitting device S_OEL4 emits light in the wavelength range of about 620 nm to about 750 nm. Thus, the fourth sub-organic light emitting device S_OEL4 may emit red light. The fourth sub-organic light emitting device S_OEL4 may control a resonance distance to emit light in the wavelength range of about 620 nm to about 750 nm. The fourth sub-organic light emitting device S_OEL4 includes a fourth anode AN4, a fourth common light emitting portion CMLP4, a light emitting layer EML1, and a fourth cathode portion CATP4 sequentially stacked in the second direction DR2.

The first anode AN1, the second anode AN2, the third anode AN3, and the fourth anode AN4 are spaced apart from each other when viewed in a cross-sectional view. The first anode AN1, the second anode AN2, the third anode AN3, and the fourth anode AN4 may be a transmissive electrode, a transflective electrode, or a reflective electrode. When the first anode AN1, the second anode AN2, the third anode AN3, and the fourth anode AN4 are transmissive electrodes, each of the first anode AN1, the second anode AN2, the third anode AN3, and the fourth anode AN4 may include a transparent metal oxide, e.g., indium tin oxide (ITO), indium zinc oxide (IZO), zinc oxide (ZnO), indium tin zinc oxide (ITZO), etc. When the first anode AN1, the second anode AN2, the third anode AN3, and the fourth anode AN4 are transflective or reflective electrodes, each of the first anode AN1, the second anode AN2, the third anode AN3, and the fourth anode AN4 may include, for example, Ag, Mg, Al, Pt, Au, Ni, Nd, Ir, Cr, or a mixture of metal and some other substance.

A hole transport region HTR is above the first anode AN1, the second anode AN2, the third anode AN3, and the fourth anode AN4. The hole transport region HTR includes a hole injection layer HIL and a hole transport layer HTL. The hole injection layer HIL and the hole transport layer HTL may be integrally formed with each other as a single layer. The hole injection layer HIL and the hole transport layer HTL may be integrally formed with each other as a single layer and may include a p-type dopant. The hole transport region HTR may include at least one of a hole buffer layer or an electron blocking layer.

The hole injection layer HIL may include, but is not limited to, a phthalocyanine compound such as copper phthalocyanine, DNTPD (N,N'-diphenyl-N,N'-bis-[4-(phenyl-m-tolyl-amino)-phenyl]-biphenyl-4,4'-diamine), m-MT-DATA(4,4',4''-tris(3-methylphenylphenylamino)triphenylamine), TDATA(4,4'4''-Tris(N,N-diphenylamino)triphenylamine), 2TNATA(4,4',4''-tris {N,-(2-naphthyl)-N-phenylamino}-triphenylamine), PEDOT/PSS(Poly(3,4-ethylenedioxythiophene)/Poly(4-styrenesulfonate), PANI/DBSA(Polyaniline/Dodecylbenzenesulfonic acid), PANI/CSA(Polyaniline/Camphor sulfonicacid), PANI/PSS ((Polyaniline)/Poly(4-styrenesulfonate), etc.

The hole injection layer HIL may further include an electric charge generating material uniformly or non-uniformly distributed in the hole injection layer HIL. The electric charge generating material may be, but is not limited to, a p-type dopant. At least a portion of the hole injection layer HIL may include the p-type dopant. The p-type dopant may be, for example, one of a quinone derivative, a metal oxide material, or a compound containing a cyano group. For instance, the p-type dopant may include one or more quinone derivatives such as TCNQ (Tetracyanoquinodimethane) or F4-TCNQ (2,3,5,6-tetrafluoro-tetracyanoquinodimethane), or one or more metal oxide materials such as a tungsten oxide material or molybdenum oxide material.

The hole transport layer HTL is on the hole injection layer HIL. The hole transport layer HTL may include, but is not limited to, carbazole-based derivatives, e.g., n-phenyl carbazole, polyvinyl carbazole, etc., fluorine-based derivatives, triphenylamine-based derivatives, e.g., TPD(N,N'-bis(3-methylphenyl)-N,N'-diphenyl-[1,1-biphenyl]-4,4'-diamine), TCTA(4,4',4''-tris(N-carbazolyl)triphenylamine), etc., NPB (N,N'-di(1-naphthyl)-N,N'-diphenylbenzidine), TAPC(4,4'-Cyclohexylidene bis[N,N-bis(4-methylphenyl)benzenamine]), etc.

The hole transport region HTR includes a first hole transport region portion HTRP1, a second hole transport region portion HTRP2, a third hole transport region portion HTRP3, a fourth hole transport region portion HTRP4, a fifth hole transport region portion HTRP5, a sixth hole transport region portion HTRP6, and a seventh hole transport region portion HTRP7. These portions may be sequentially connected in order of the first hole transport region portion HTRP1, the fifth hole transport region portion HTRP5, the second hole transport region portion HTRP2, the sixth hole transport region portion HTRP6, the third hole transport region portion HTRP3, the seventh hole transport region portion HTRP7, and the fourth hole transport region portion HTRP4 and may be integrally formed in a single unit.

The first hole transport region portion HTRP1 is in the first sub-organic light emitting device S_OEL1 and overlaps the first anode AN1. The second hole transport region portion HTRP2 is in the second sub-organic light emitting device S_OEL2 and overlaps the second anode AN2. The third hole transport region portion HTRP3 is in the third sub-organic light emitting device S_OEL3 and overlaps the third anode AN3. The fourth hole transport region portion HTRP4 is in the fourth sub-organic light emitting device S_OEL4 and overlaps the fourth anode AN4. The fifth hole transport region portion HTRP5 is between the first and second hole transport region portions HTRP1 and HTRP2. The sixth hole transport region portion HTRP6 is between the second and third hole transport region portions HTRP2 and HTRP3. The seventh hole transport region portion HTRP7 is between the third and fourth hole transport region portions HTRP3 and HTRP4.

The hole injection layer HIL includes a first hole injection portion HILP1, a second hole injection portion HILP2, a third hole injection portion HILP3, a fourth hole injection portion HILP4, a fifth hole injection portion HILP5, a sixth hole injection portion HILP6, and a seventh hole injection portion HILP7. These portions may be sequentially connected in order of the first hole injection portion HILP1, the fifth hole injection portion HILP5, the second hole injection portion HILP2, the sixth hole injection portion HILP6, the third hole injection portion HILP3, the seventh hole injection portion HILP7, and the fourth hole injection portion HILP4 and may be integrally formed in a single unit.

The first hole injection portion HILP1 is in the first sub-organic light emitting device S_OEL1. The second hole injection portion HILP2 is in the second sub-organic light emitting device S_OEL2. The third hole injection portion HILP3 is in the third sub-organic light emitting device S_OEL3. The fourth hole injection portion HILP4 is in the fourth sub-organic light emitting device S_OEL4. The fifth hole injection portion HILP5 is between the first and second hole injection portions HILP1 and HILP2. The sixth hole injection portion HILP6 is between the second and third hole injection portions HILP2 and HILP3. The seventh hole injection portion HILP7 is between the third and fourth hole injection portions HILP3 and HILP4.

The hole transport layer HTL includes a first hole transport portion HTLP1, a second hole transport portion HTLP2, a third hole transport portion HTLP3, a fourth hole transport portion HTLP4, a fifth hole transport portion HTLP5, a sixth hole transport portion HTLP6, and a seventh hole transport portion HTLP7. The first hole transport portion HTLP1, the second hole transport portion HTLP2, the third hole transport portion HTLP3, the fourth hole transport portion HTLP4, the fifth hole transport portion HTLP5, the sixth hole transport portion HTLP6, and the seventh hole transport portion HTLP7. These portions may be sequentially connected in order of the first hole transport portion HTLP1, the fifth hole transport portion HTLP5, the second hole transport portion HTLP2, the sixth hole transport portion HTLP6, the third hole transport portion HTLP3, the seventh hole transport portion HTLP7, and the fourth hole transport portion HTLP4 and may be integrally formed in a single unit.

The first hole transport portion HTLP1 is in the first sub-organic light emitting device S_OEL1. The second hole transport portion HTLP2 is in the second sub-organic light emitting device S_OEL2. The third hole transport portion HTLP3 is in the third sub-organic light emitting device S_OEL3. The fourth hole transport portion HTLP4 is in the fourth sub-organic light emitting device S_OEL4. The fifth hole transport portion HTLP5 is between the first and second hole transport portions HTLP1 and HTLP2. The sixth hole transport portion HTLP6 is between the second and third hole transport portions HTLP2 and HTLP3. The seventh hole transport portion HTLP7 is between the third and fourth hole injection portions HTLP3 and HTLP4.

A first common light emitting layer CML1 is on the hole transport region HTR. The first common light emitting layer CML1 emits a third light having a wavelength longer than that of at least one of first or second lights. In one embodiment, the third light may have a wavelength in the range of about 495 nm to about 570 nm. The first common light emitting layer CML1 may include a material emitting green light and may include a fluorescent or phosphorescent material.

The first common light emitting layer CML1 may include a host and a dopant. The host may include, for example, Alq3(tris(8-hydroxyquinolino)aluminum), CBP(4,4'-bis(N-carbazolyl)-1,1'-biphenyl), PVK(poly(n-vinylcabazole), ADN(9,10-di(naphthalene-2-yl)anthracene), TCTA(4,4',4"-Tris(carbazol-9-yl)-triphenylamine), TPBi(1,3,5-tris(N-phenylbenzimidazole-2-yl)benzene), TBADN(3-tert-butyl-9,10-di(naphth-2-yl)anthracene), DSA(distyrylarylene), CDBP(4,4'-bis(9-carbazolyl)-2,2'''-dimethyl-biphenyl), and/or MADN(2-Methyl-9,10-bis(naphthalen-2-yl)anthracene). The dopant may be, for example, a metal complex (e.g., Ir(ppy)3(fac-tris(2-phenylpyridine)iridium)) or an organometallic complex.

The first common light emitting layer CML1 includes the first common light emitting portion CMLP1, a second common light emitting portion CMLP2, a third common light emitting portion CMLP3, a fourth common light emitting portion CMLP4, a fifth common light emitting portion CMLP5, a sixth common light emitting portion CMLP6, and a seventh common light emitting portion CMLP7. These portions may be sequentially connected in order of the first common light emitting portion CMLP1, the fifth common light emitting portion CMLP5, the second common light emitting portion CMLP2, the sixth common light emitting portion CMLP6, the third common light emitting portion CMLP3, the seventh common light emitting portion CMLP7, and the fourth common light emitting portion CMLP4.

The first common light emitting portion CMLP1 is in the first sub-organic light emitting device S_OEL1 and overlaps the first anode AN1 and the first hole transport region portion HTRP1. The second common light emitting portion CMLP2 is in the second sub-organic light emitting device S_OEL2 and overlaps the second anode AN2 and the second hole transport region portion HTRP2. The third common light emitting portion CMLP3 is in the third sub-organic light emitting device S_OEL3 and overlaps the third anode AN3 and the third hole transport region portion HTRP3. The fourth common light emitting portion CMLP4 is in the fourth sub-organic light emitting device S_OEL4 and overlaps the fourth anode AN4 and the fourth hole transport region portion HTRP4. The fifth common light emitting portion CMLP5 is between the first and second common light emitting portions CMLP1 and CMLP2. The sixth common light emitting portion CMLP6 is between the second and third common light emitting portions CMLP2 and CMLP3. The seventh common light emitting portion CMLP7 is between the third and fourth common light emitting portions CMLP3 and CMLP4.

The first auxiliary layer AL1 is above the first common light emitting layer CML1 and between the second common light emitting portion CMLP2 and the second sub-light emitting portion SMLP2 or on the second sub-light emitting portion SMLP2. The first auxiliary layer AL1 is in the second sub-organic light emitting device S_OEL2 and is not in the first sub-organic light emitting device S_OEL1, the third sub-organic light emitting device S_OEL3, and the fourth sub-organic light emitting device S_OEL4. The first auxiliary layer AL1 overlaps the second anode AN2.

The first auxiliary layer AL1 may compensate resonance in the second sub-organic light emitting device S_OEL2. The first auxiliary layer AL1 may compensate resonance distance in the second sub-organic light emitting device S_OEL2. The first auxiliary layer AL1 may control the second sub-organic light emitting device S_OEL2 to allow the second sub-organic light emitting device S_OEL2 to emit light in the wavelength range of about 459 nm to about 490 nm. The first auxiliary layer AL1 may include the same material as the hole transport layer HTL or a different material.

Referring to FIG. 2, a second auxiliary layer AL2 is on the first common light emitting layer CML1 and the light emitting layer EML1. The first and second auxiliary layers AL1 and AL2 may have the same thickness or different thicknesses.

The second auxiliary layer AL2 is between the fourth common light emitting portion CMLP4 and the light emitting layer EML1. The second auxiliary layer AL2 is in the fourth sub-organic light emitting device S_OEL4 and is not included in the first sub-organic light emitting device S_OEL1, the second sub-organic light emitting device S_OEL2, and the third sub-organic light emitting device S_OEL3. The second auxiliary layer AL2 overlaps the fourth anode AN4.

The second auxiliary layer AL2 may compensate resonance in the fourth sub-organic light emitting device S_OEL4. The second auxiliary layer AL2 may compensate resonance distance in the fourth sub-organic light emitting device S_OEL4. The second auxiliary layer AL2 may include substantially the same material as that of the hole transport layer HTL or may include a different material.

Referring again to FIGS. 1 and 2, a second common light emitting layer CML2 is on the first common light emitting layer CML1 and emits second light in a wavelength range of about 440 nm to about 490 nm. Thus, the second common light emitting layer CML2 may include material emitting blue light. In one embodiment, the second common light emitting layer CML2 may include a fluorescent material or a phosphorescent material. For example, the second common light emitting layer CML2 includes PBD:Eu(DBM)3(Phen)(tris(dibenzoylmethanato)phenanthoroline europium) or Perylene.

In one embodiment, the second common light emitting layer CML2 may include a host and a dopant. The host may be, for example, Alq3(tris(8-hydroxyquinolino)aluminum), CBP (4,4'-bis(N-carbazolyl)-1,1'-biphenyl), PVK(poly(n-vinylcabazole), ADN (9,10-di(naphthalene-2-yl)anthracene), TCTA(4,4',4"-Tris(carbazol-9-yl)-triphenylamine), TPBi(1,3,5-tris(N-phenylbenzimidazole-2-yl)benzene), TBADN(3-tert-butyl-9,10-di(naphth-2-yl)anthracene), DSA(distyrylarylene), CDBP(4,4'-bis(9-carbazolyl)-2,2"-dimethyl-biphenyl), MADN(2-Methyl-9,10-bis(naphthalen-2-yl)anthracene). The dopant may include, for example, a metal complex such as PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium), PtOEP(octaethylporphyrin platinum), etc., or organometallic complex.

The second common light emitting layer CML2 includes a first sub-light emitting portion SMLP1, a second sub-light emitting portion SMLP2, and a third sub-light emitting portion SMLP3. These portions may be sequentially connected in order of the first sub-light emitting portion SMLP1, the third sub-light emitting portion SMLP3, and the second sub-light emitting portion SMLP2 and may integrally formed in a single unit.

The first sub-light emitting portion SMLP1 is in the first sub-organic light emitting device S_OEL1 and overlaps the first anode AN1, the first hole transport region portion HTRP1, and the first common light emitting portion CMLP1. The second sub-light emitting portion SMLP2 is in the second sub-organic light emitting device S_OEL2 and overlaps the second anode AN2, the second hole transport region portion HTRP2, the first auxiliary layer AL1, and the second common light emitting portion CMLP2. The third sub-light emitting portion SMLP3 is between the first sub-light emitting portion SMLP1 and the second sub-light emitting portion SMLP2.

Referring to FIG. 2, an intermediate auxiliary layer IML is between the first and second common light emitting layers CML1 and CML2. The intermediate auxiliary layer IML prevents holes from being transported to the second common light emitting layer CML2 from the first common light emitting layer CML1. Therefore, the intermediate auxiliary layer IML prevents the third light from being emitted from each of the first and second sub-organic light emitting devices S_OEL1 and S_OEL2.

The intermediate auxiliary layer IML includes a first intermediate auxiliary portion IMLP1, a second intermediate auxiliary portion IMLP2, and a third intermediate auxiliary portion IMLP3. These portions may be sequentially connected in order of the first intermediate auxiliary portion IMLP1, the third intermediate auxiliary portion IMLP3, and the second intermediate auxiliary portion IMLP2.

The first intermediate auxiliary portion IMLP1 is in the first sub-organic light emitting device S_OEL1 and overlaps the first anode AN1, the first hole transport region portion HTRP1, and the first common light emitting portion CMLP1. The second intermediate auxiliary portion IMLP2 is in the second sub-organic light emitting device S_OEL2 and overlaps the second anode AN2, the second hole transport region portion HTRP2, the first auxiliary layer AL1, and the second common light emitting portion CMLP2. The third intermediate auxiliary portion IMLP3 is between the first and second intermediate auxiliary portions IMLP1 and IMLP2.

Referring again to FIGS. 1 and 2, the light emitting layer EML1 is on the first common light emitting layer CML1 and is included in the fourth sub-organic light emitting device S_OEL4. The light emitting layer EML1 emits first light in the wavelength range of about 620 nm to about 750 nm. The light emitting layer EML1 includes a material emitting red light. In one embodiment, the light emitting layer EML1 includes a fluorescent material or a phosphorescent material. For example, the light emitting layer EML includes a fluorescent material containing PBD:Eu(DBM)3(Phen)(tris(dibenzoylmethanato)phenanthoroline europium) or Perylene.

The light emitting layer EML1 may include a host and a dopant. The host may include, for example, Alq3(tris(8-hydroxyquinolino)aluminum), CBP(4,4'-bis(N-carbazolyl)-1,1'-biphenyl), PVK(poly(n-vinylcabazole), ADN(9,10-di(naphthalene-2-yl)anthracene), TCTA(4,4',4"-Tris(carbazol-9-yl)-triphenylamine), TPBi(1,3,5-tris(N-phenylbenzimidazole-2-yl)benzene), TBADN(3-tert-butyl- 9,10-di(naphth-2-yl)anthracene), DSA(distyrylarylene), CDBP(4,4'-bis(9-carbazolyl)-2,2"-dimethyl-biphenyl), MADN(2-Methyl-9,10-bis(naphthalen-2-yl)anthracene).

The dopant may include, for example, a metal complex, such as PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium), PtOEP(octaethylporphyrin platinum), etc., or organometallic complex.

An intermediate connecting layer may be disposed between the second common light emitting layer CML2 and the electron transport region ETR, between the first common light emitting layer CML1 and the electron transport region ETR, and/or between the light emitting layer EML1 and electron transport region ETR. The intermediate connecting layer may control charge balance between the second common light emitting layer CML2 and the electron transport region ETR, between the first common light emitting layer CML1 and the electron transport region ETR, and/or between the light emitting layer EML1 and electron transport region ETR.

The electron transport region ETR is on the first common light emitting layer CML1, the second common light emitting layer CML2, and the light emitting layer EML1. The electron transport region ETR is on an entire surface of the light emitting layer EML1. The electron transport region ETR may further include an electron transport layer ETL and an electron injection layer EIL on the electron transport layer ETL. In this case, the electron injection layer EIL may be omitted.

The electron transport layer ETL may include, for example, Alq3(Tris(8-hydroxyquinolinato)aluminum), TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminum), ebq2(berylliumbis(benzoquinolin-10-olate), ADN(9,10-di(naphthalene-2-yl)anthracene), and a mixture thereof. The electron transport layer ETL may have a thickness in the range of about 100 angstroms to about 1000 angstroms. In one embodiment the electron transport layer ETL may have a thickness in the range of about 150 angstroms to about 400 angstroms. When the thickness of the electron transport layer ETL satisfies the above-mentioned ranges, superior electron transport characteristics may be obtained without raising the driving voltage.

The electron injection layer EIL may include, for example, a lanthanide-based metal, e.g., LiF, LiQ (Lithium quinolate), $Li_2O$, BaO, NaCl, CsF, Yb, etc., or a metal halide, e.g., RbCl, RbI, etc. The electron injection layer EIL may include a mixture of an electron transport material and an organo metal salt with insulating property. The organo metal salt has an energy band gap of about 4 eV or more. For example, the organo metal salt may include metal acetate, metal benzoate, metal acetoacetate, metal acetylacetonate, or metal stearate. The electron injection layer EIL may have a thickness in the range of about 1 angstroms to about 100 angstroms. In one embodiment, the electron injection layer has a thickness in the range of about 3 angstroms to about 90 angstroms. When the thickness of the electron injection layer EIL satisfies the above-mentioned range, superior electron injection characteristics may be obtained without raising the driving voltage.

The electron transport region ETR includes a first electron transport region portion ETRP1, a second electron transport region portion ETRP2, a third electron transport region portion ETRP3, a fourth electron transport region portion ETRP4, a fifth electron transport region portion ETRP5, a sixth electron transport region portion ETRP6, and a seventh electron transport region portion ETRP7. These portions may be sequentially connected in order of the first electron transport region portion ETRP1, the fifth electron transport region portion ETRP5, the second electron transport region portion ETRP2, the sixth electron transport region portion ETRP6, the third electron transport region portion ETRP3, the seventh electron transport region portion ETRP7, and the fourth electron transport region portion ETRP4 and may be integrally formed in a single unit.

The first electron transport region portion ETRP1 is in the first sub-organic light emitting device S_OEL1 and overlaps the first anode AN1, the first hole transport region portion HTRP1, the first common light emitting portion CMLP1, and the first sub-light emitting portion SMLP1. The second electron transport region portion ETRP2 is in the second sub-organic light emitting device S_OEL2 and overlaps the second anode AN2, the second hole transport region portion HTRP2, the second common light emitting portion CMLP2, the first auxiliary layer AL1, and the second sub-light emitting portion SMLP2. The third electron transport region portion ETRP3 is in the third sub-organic light emitting device S_OEL3 and overlaps the third anode AN3, the third hole transport region portion HTRP3, and the third common light emitting portion CMLP3. The fourth electron transport region portion ETRP4 is in the fourth sub-organic light emitting device S_OEL4 and overlaps the fourth anode AN4, the fourth hole transport region portion HTRP4, the fourth common light emitting portion CMLP4, and the light emitting layer EML. The fifth electron transport region portion ETRP5 is between the first electron transport region portion ETRP1 and the second electron transport region portion ETRP2. The sixth electron transport region portion ETRP6 is between the second electron transport region portion ETRP2 and the third electron transport region portion ETRP3. The seventh electron transport region portion ETRP7 is between the third electron transport region portion ETRP3 and the fourth electron transport region portion ETRP4.

The electron transport layer ETL includes a first electron transport portion ETLP1, a second electron transport portion ETLP2, a third electron transport portion ETLP3, a fourth electron transport portion ETLP4, a fifth electron transport portion ETLP5, a sixth electron transport portion ETLP6, and a seventh electron transport portion ETLP7. These portions may be sequentially connected in order of the first electron transport portion ETLP1, the fifth electron transport portion ETLP5, the second electron transport portion ETLP2, the sixth electron transport portion ETLP6, the third electron transport portion ETLP3, the seventh electron transport portion ETLP7, and the fourth electron transport portion ETLP4 and may be integrally formed in a single unit.

The first electron transport portion ETLP1 is in the first sub-organic light emitting device S_OEL1. The second electron transport portion ETLP2 is in the second sub-organic light emitting device S_OEL2. The third electron transport portion ETLP3 is in the third sub-organic light emitting device S_OEL3. The fourth electron transport portion ETLP4 is in the fourth sub-organic light emitting device S_OEL4. The fifth electron transport portion ETLP5 is between the first electron transport portion ETLP1 and the second electron transport portion ETLP2. The sixth electron transport portion ETLP6 is between the second electron transport portion ETLP2 and the third electron transport portion ETLP3. The seventh electron transport portion ETLP7 is between the third electron transport portion ETLP3 and the fourth electron transport portion ETLP4.

The electron injection layer EIL includes a first electron injection portion EILP1, a second electron injection portion EILP2, a third electron injection portion EILP3, a fourth electron injection portion EILP4, a fifth electron injection portion EILP5, a sixth electron injection portion EILP6, and a seventh electron injection portion EILP7. These portions may be sequentially connected in order of the first electron injection portion EILP1, the fifth electron injection portion EILP2, the second electron injection portion EILP2, the sixth electron injection portion EILP6, the third electron injection portion EILP3, the seventh electron injection portion EILP7, and the fourth electron injection portion EILP4.

The first electron injection portion EILP1 is in the first sub-organic light emitting device S_OLE1. The second electron injection portion EILP2 is in the second sub-organic light emitting device S_OLE2. The third electron injection portion EILP3 is included in the third sub-organic light emitting device S_OLE3. The fourth electron injection portion EILP4 is in the fourth sub-organic light emitting device S_OLE4. The fifth electron injection portion EILP5 is between the first electron injection portion EILP1 and the second electron injection portion EILP2. The sixth electron injection portion EILP6 is between the second electron injection portion EILP2 and the third electron injection portion EILP3. The seventh electron injection portion EILP7 is between the third electron injection portion EILP3 and the fourth electron injection portion EILP4.

A cathode CAT is on the electron transport region ETR and is disposed on an entire surface of the electron transport region ETR. The cathode CAT may be a common electrode or a negative electrode. The cathode CAT may be a transmissive electrode, the transflective electrode, or the reflective electrode. When the cathode CAT is a transmissive electrode, the cathode CAT may include, for example, Li, Ca, LiF/Ca, LiF/Al, Al, Mg, BaF, Ba, Ag, a compound thereof, or a mixture thereof, e.g., a mixture of Ag and Mg.

The cathode CAT may include an auxiliary electrode, which includes a layer formed by depositing the above-mentioned material toward the first common light emitting layer CML1 and a transparent metal oxide disposed on the layer, e.g., indium tin oxide (ITO), indium zinc oxide (IZO), zinc oxide (ZnO), indium tin zinc oxide (ITZO), Mo, Ti, etc.

When the cathode CAT is a transflective electrode or the reflective electrode, the cathode CAT may include, for example, Ag, Mg, Cu, Al, Pt, Pd, Au, Ni, Nd, Ir, Cr, Li, Ca, LiF/Ca, LiF/Al, Mo, Ti, a compound thereof, or a mixture thereof, e.g., a mixture of Ag and Mg. In another embodiment, the cathode CAT may have a multi-layer structure of a reflective layer or a transflective layer, which is formed of the above-mentioned materials, and a transparent conductive layer formed of ITO, IZO, ZnO, or ITZO.

When the organic light emitting device OEL is a front surface light emitting type, each of the first, second, third, and fourth anodes AN1, AN2, AN3, and AN4 may be a reflective electrode and the cathode CAT may be a transmissive electrode or the transflective electrode. When the organic light emitting device OEL is a rear surface light emitting type, each of the first, second, third, and fourth anodes AN1, AN2, AN3, and AN4 may be a transmissive electrode or a transflective electrode and the cathode CAT may be a reflective electrode.

The cathode CAT includes a first cathode portion CATP1, a second cathode portion CATP2, a third cathode portion CATP3, a fourth cathode portion CATP4, a fifth cathode portion CATP5, a sixth cathode portion CATP6, and a seventh cathode portion CATP7. These portions may be sequentially connected in order of the first cathode portion CATP1, the fifth cathode portion CATP5, the second cathode portion CATP2, the sixth cathode portion CATP6, the third cathode portion CATP3, the seventh cathode portion CATP7, and the fourth cathode portion CATP4.

The first cathode portion CATP1 is in the first sub-organic light emitting device S_OEL1 and overlaps each of the first anode AN1, the first hole transport region portion HTRP1, the first common light emitting portion CMLP1, the first sub-light emitting portion SMLP1, and the first electron transport region portion ETRP1. The second cathode portion CATP2 is in the second sub-organic light emitting device S_OEL2 and overlaps each of the second anode AN2, the second hole transport region portion HTRP2, the second common light emitting portion CMLP2, the first auxiliary layer AL1, the second sub-light emitting portion SMLP2, and the second electron transport region portion ETRP2. The third cathode portion CATP3 is in the third sub-organic light emitting device S_OEL3 and overlaps each of the third anode AN3, the third hole transport region portion HTRP3, the third common light emitting portion CMLP3, and the third electron transport region portion ETRP3. The fourth cathode portion CATP4 is in the fourth sub-organic light emitting device S_OEL4 and overlaps each of the fourth anode AN4, the fourth hole transport region portion HTRP4, the fourth common light emitting portion CMLP4, the light emitting layer EML1, and the fourth electron transport region portion ETRP4. The fifth cathode portion CAT5 is between the first cathode portion CAT1 and the second cathode portion CAT2. The sixth cathode portion CAT6 is between the second cathode portion CAT2 and the third cathode portion CAT3. The seventh cathode portion CAT7 is between the third cathode portion CAT3 and the fourth cathode portion CAT4.

In the organic light emitting device OEL, when voltages are respectively applied to the first anode AN1, the second anode AN2, the third anode AN3, the fourth anode AN4, and the cathode CAT, holes injected from the first, second, third, and fourth anodes AN1, AN2, AN3, and AN4 move to the first common light emitting layer CML1, the second common light emitting layer CML2, and the light emitting layer EML1 through the hole transport region HTR. Also, electrons injected from the cathode CAT move to the light emitting layer EML1, the second common light emitting layer CML2, and the first common light emitting layer CML1 through the electron transport region ETR. The electrons and holes recombine in the light emitting layer EML1, the first common light emitting layer CML1, and the second common light emitting layer CML2 to generate excitons, and the organic light emitting device OEL emits light when the excitons return to a ground state from an excited state.

One type of organic light emitting device which has been proposed includes a sub-organic light emitting device emitting sky blue light and a sub-organic light emitting device emitting deep blue light. The light emitting layer emitting the sky blue light is formed through a separate process from a process used to form the light emitting layer emitting the deep blue light. Accordingly, the process of manufacturing the organic light emitting device is complex. Also, light emitting efficiency may be deteriorated due to foreign substances entering the organic light emitting device when the organic light emitting device is manufactured.

However, according to one or more embodiments, the light emitting layer emitting sky blue light and the light emitting layer emitting deep blue light are formed in a single process to have a single-layer structure. Therefore, the process of manufacturing the organic light emitting device is simplified. Also, the light emitting efficiency is prevented from being deteriorated since the light emitting layers are substantially not exposed to the foreign substances.

Figure 3:
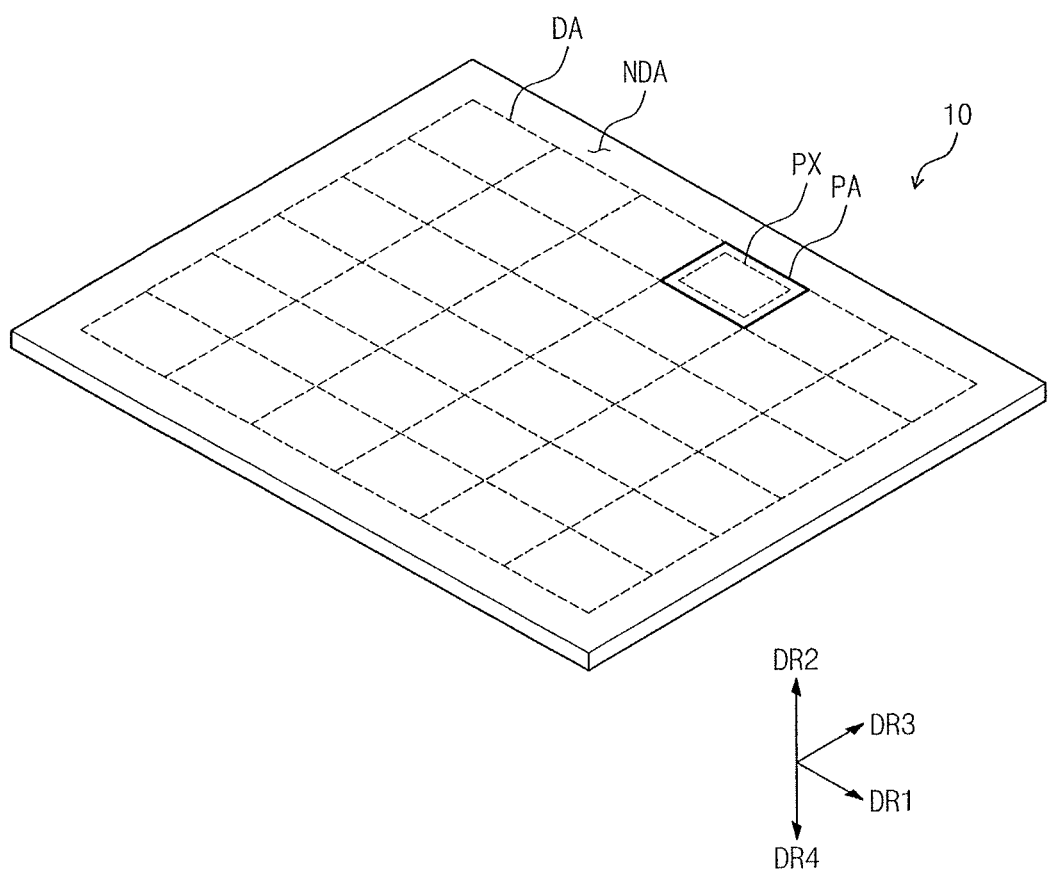
FIG. 3 illustrates an embodiment of a display device.

FIG. 3 illustrates an embodiment of a display device 10 which includes a display area DA and a non-display area NDA. The display area DA displays an image and has a predetermined (e.g., substantially a rectangular shape) when viewed in a thickness direction DR4 of the display device 10. The shape of the display area DA may be different in another embodiment.

The display area DA includes a plurality of pixel areas PA arranged in a matrix form. A plurality of pixels PX is disposed in the pixel areas PA, respectively. Each pixel PX includes at one or more organic light emitting devices OEL (refer, e.g., to FIG. 1). For example, each pixel PX includes a plurality of sub-pixels, e.g., a first sub-pixel SPX1, a second sub-pixel SPX2, a third sub-pixel SPX3, and a fourth sub-pixel SPX4.

The non-display area NDA does not display an image and surrounds the display area DA when viewed in the thickness direction DR4. The non-display area NDA is adjacent to the display area DA in first and third directions DR1 and DR3. The third direction DR3 crosses the first and second directions DR1 and DR2.

The display device 10 may operate in a first mode, a second mode, or a third mode. In the first mode, each of first, second, third, and fourth light emitting areas EA1, EA2, EA3, and EA4 (refer, e.g., to FIG. 5) emits light. In the second mode, light is emitted from the first, third, and fourth light emitting areas EA1, EA3, and EA4 (refer, e.g., to FIG. 5) and is not emitted from the second light emitting area EA2. In the third mode, light is emitted from the second, third, and fourth light emitting areas EA2, EA3, and EA4 (refer, e.g., to FIG. 5) and is not emitted from the first light emitting area EA2.

Figure 4A:
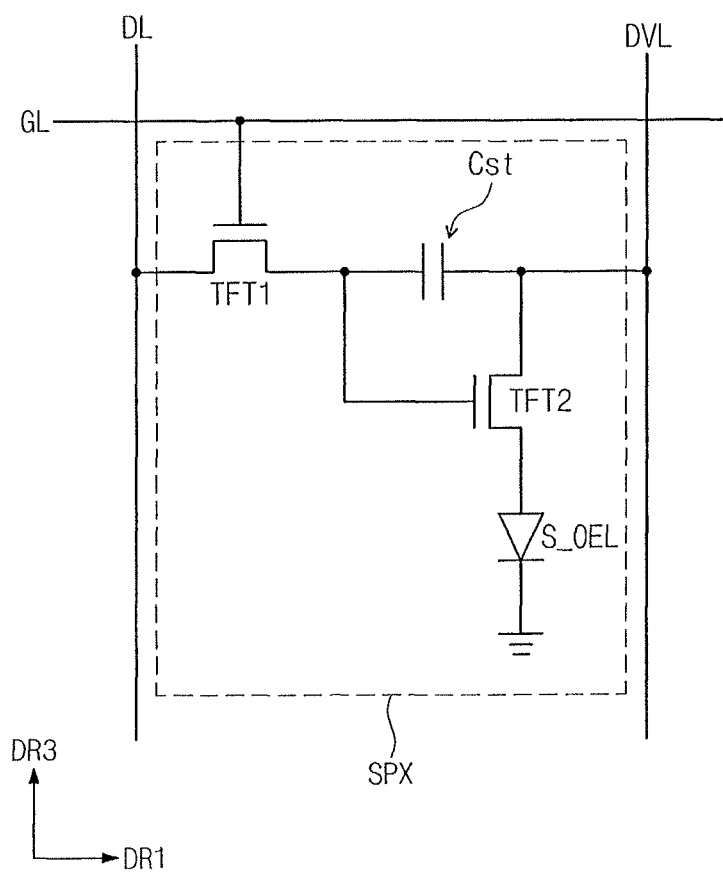
FIGS. 4A and 4B illustrates an embodiment of a sub-pixel and FIG. 4C illustrates a view along section line I-I' in FIG. 4B.
Figure 4B:
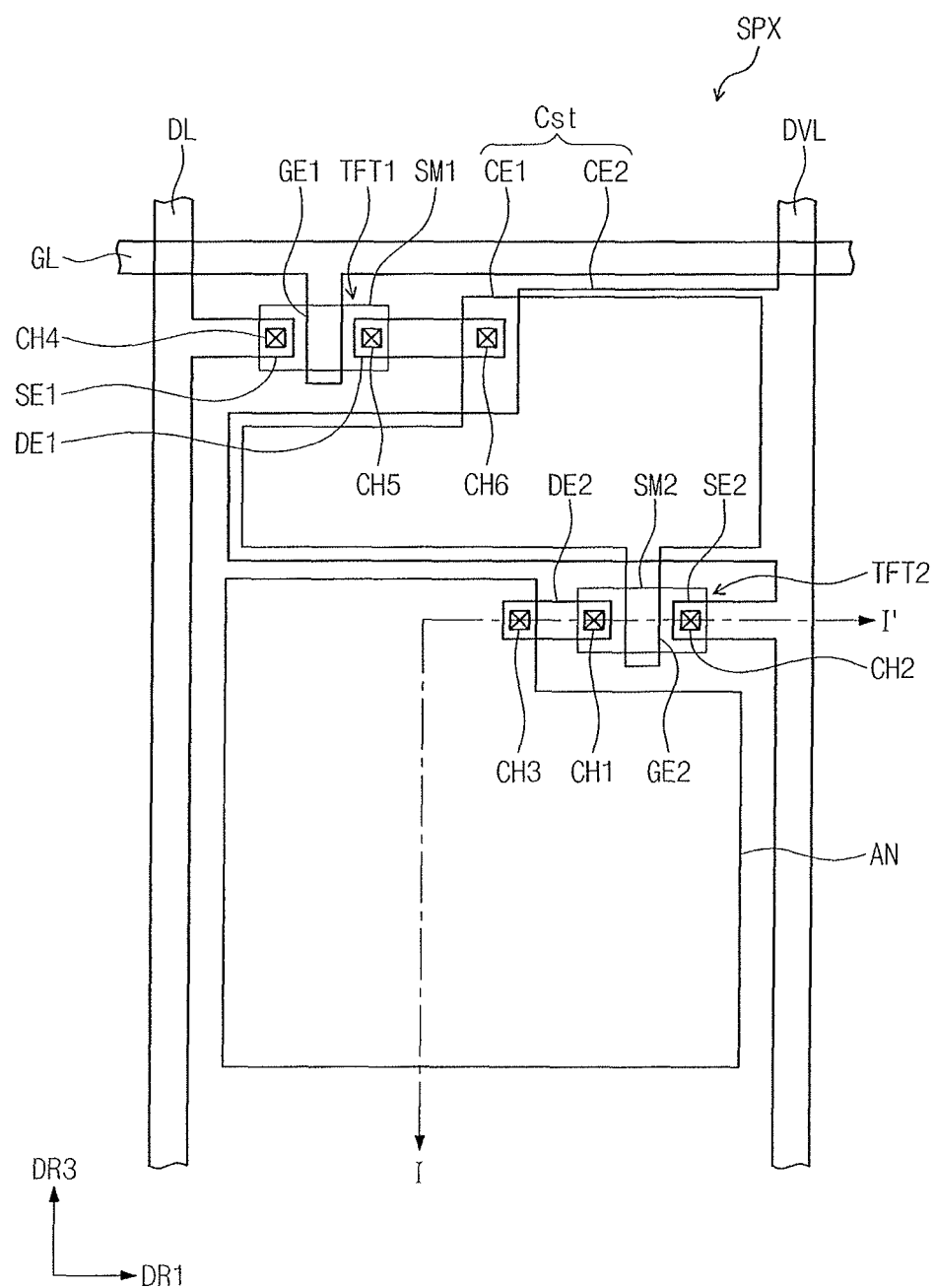
Figure 4C:
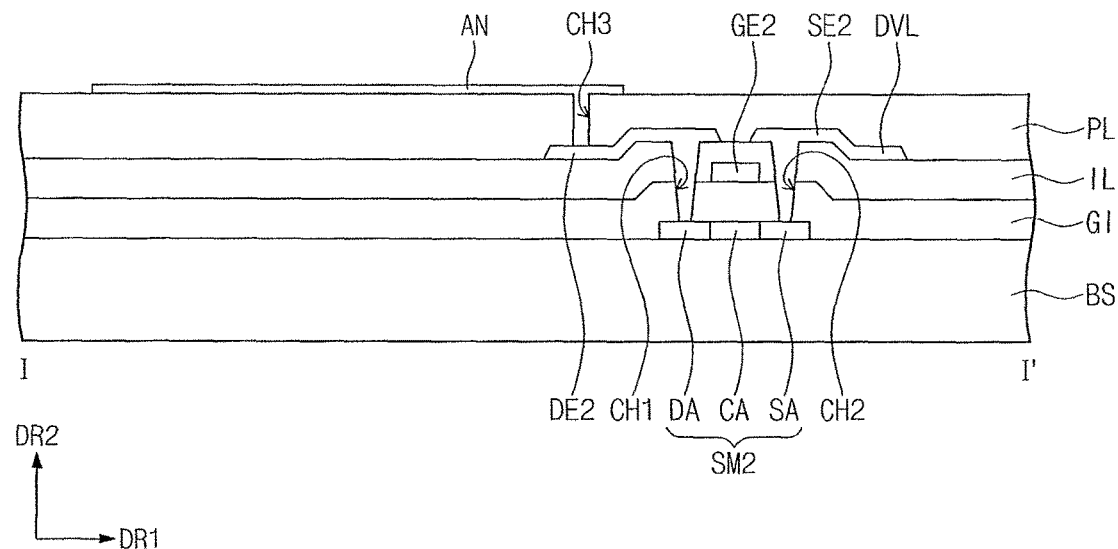

FIG. 4A illustrates an embodiment of a circuit representative of the sub-pixels in the display device 10. FIG. 4B illustrates a layout embodiment representative of the sub-pixels in the display device 10. FIG. 4C is a cross-sectional view taken along a line I-I' in FIG. 4B.

Referring to FIGS. 4A to 4C, each sub-pixel SPX is connected to a line part that or is connected to a gate line GL, a data line DL, and a driving voltage line DVL. Each sub-pixel SPX includes thin film transistors TFT1 and TFT2 connected to the line part, the sub-organic light emitting device S_OEL connected to the thin film transistors TFT1 and TFT2, and a capacitor Cst. Each sub-pixel SPX emits one of red light, green light, or blue light.

The gate line GL extends in the first direction DR1. The data line DL extends in the third direction DR3 crossing the gate line GL. The driving voltage line DVL extends in the third direction DR3 that may be substantially the same as the data line DL. The gate line GL applies a scan signal to the thin film transistors TFT1 and TFT2. The data line DL applies a data signal to the thin film transistors TFT1 and TFT2. The driving voltage line DVL applies a driving voltage to the thin film transistors TFT1 and TFT2.

The thin film transistors TFT1 and TFT2 include a driving thin film transistor TFT2 to control the sub-organic light emitting device S_OEL and a switching thin film transistor TFT1 to switch the driving thin film transistor TFT2. In the present exemplary embodiment, each sub-pixel SPX includes two thin film transistors TFT1 and TFT2. In another embodiment, each sub-pixel may include a different number of thin film transistors. For example, each sub-pixel SPX may include one thin film transistor and a capacitor, or three or more thin film transistors and two or more capacitors.

The switching thin film transistor TFT1 includes a first gate electrode GE1, a first source electrode SE1, and a first drain electrode DE1. The first gate electrode GE1 is connected to the gate line GL. The first source electrode SE1 is connected to the data line DL. The first drain electrode DE1 is connected to a first common electrode CE1 through a fifth contact hole CH5. The switching thin film transistor TFT1 applies the data signal from the data line to the driving thin film transistor TFT2 in response to the scan signal provided through the gate line GL.

The driving thin film transistor TFT2 includes a second gate electrode GE2, a second source electrode SE2, and a second drain electrode DE2. The second gate electrode GE2 is connected to the first common electrode CE1. The second source electrode SE2 is connected to the driving voltage line DVL. The second drain electrode DE2 is connected to the anode AN through a third contact hole CH3.

The capacitor Cst is connected between the second gate electrode GE2 of the driving thin film transistor TFT2 and the second source electrode SE2 of the driving thin film transistor TFT2. The capacitor Cst is charged with the data signal applied to the second gate electrode GE2 of the driving thin film transistor TFT2 and maintains the charge voltage therein. The capacitor Cst includes the first common electrode CE1 connected to the first drain electrode DE1 through a sixth contact hole CH6 and a second common electrode CE2 connected to the driving voltage line DVL.

The display device 10 according to the present exemplary embodiment includes a base substrate BS on which the thin film transistors TFT1 and TFT2 and the organic light emitting device OEL (refer, e.g., to FIG. 1) are stacked. The base substrate BS includes the first light emitting area EA1, the second light emitting area EA2, the third light emitting area EA3, the fourth light emitting area EA4, and non-light emitting areas NEA1, NEA2, NEA3, and NEA4 (refer, e.g., to FIG. 5).

The base substrate BS may include an insulating material, e.g., glass, plastic, crystal, etc. The base substrate BS may include an organic polymer, e.g., polyethylene terephthalate (PET), polyethylene naphthalate (PEN), polyimide, and polyether sulfone. The materials for the base substrate BS may be selected, for example, in consideration of mechanical strength, thermal stability, transparency, surface smoothness, tractability, water repellency, etc.

A substrate buffer layer may be disposed on the base substrate BS. The substrate buffer layer may prevent impurities from being diffused to the switching thin film transistor TFT1 and the driving thin film transistor TFT2. The substrate buffer layer may be formed of silicon nitride (SiNx), silicon oxide (SiOx), or silicon oxy-nitride (SiOxNy), or omitted depending on materials and process conditions for the base substrate BS.

A first semiconductor layer SM1 and a second semiconductor layer SM2 are on the base substrate BS. The first and second semiconductor layers SM1 and SM2 include a semiconductor material and serve as active layers of the switching thin film transistor TFT1 and the driving thin film transistor TFT2, respectively. Each of the first and second semiconductor layers SM1 and SM2 includes a source area SA, a drain area DA, and a channel area CA between the source area SA and the drain area DA. Each of the first and second semiconductor layers SM1 and SM2 may be formed of an inorganic semiconductor or an organic semiconductor. The source area SA and the drain area DA are doped with an n-type impurity or a p-type impurity.

A gate insulating layer GI is on the first and second semiconductor layers SM1 and SM2. The gate insulating layer GI covers the first and second semiconductor layers SM1 and SM2. The gate insulating layer GI includes an organic insulating material or an inorganic insulating material.

The first and second gate electrodes GE1 and GE2 are on the gate insulating layer GI. The first and second gate electrodes GE1 and GE2 cover corresponding areas of the channel areas CA of the first and second semiconductor layers SM1 and SM2, respectively.

An inter-insulating layer IL is on the first and second gate electrodes GE1 and GE2 and covers the first and second gate electrodes GE1 and GE2. The inter-insulating layer IL may include an organic or inorganic insulating material.

The first source electrode SE, the first drain electrode DE1, the second source electrode SE2, and the second drain electrode DE2 are on the inter-insulating layer IL. The second drain electrode DE2 makes contact with the drain area DA of the second semiconductor layer SM2 through a first contact hole CH1 formed through the gate insulating layer GI and the inter-insulating layer IL. The second source electrode SE2 makes contact with the source area SA of the second semiconductor layer SM2 through a second contact hole CH2 formed through the gate insulating layer GI and the inter-insulating layer IL. The first source electrode SE1 makes contact with the source area of the first semiconductor layer SM1 through a fourth contact hole CH4 formed through the gate insulating layer GI and the inter-insulating layer IL. The first drain electrode DE1 makes contact with the drain area of the first semiconductor layer SM1 through a fifth contact hole CH5 formed through the gate insulating layer GI and the inter-insulating layer IL.

A passivation layer PL is on the first source electrode SE1, the first drain electrode DE1, the second source electrode SE2, and the second drain electrode DE2. The passivation layer PL serves as a protective layer to protect the switching thin film transistor TFT1 and the driving thin film transistor TFT2 or serves as a planarization layer to planarize an upper surface of the first source electrode SE1, the first drain electrode DE1, the second source electrode SE2, and the second drain electrode DE2.

The anode AN is on the passivation layer PL and may be a positive electrode. The anode AN is connected to the second drain electrode DE2 of the driving thin film transistor TFT2 through a third contact hole CH3 formed through passivation layer PL.

Figure 5:
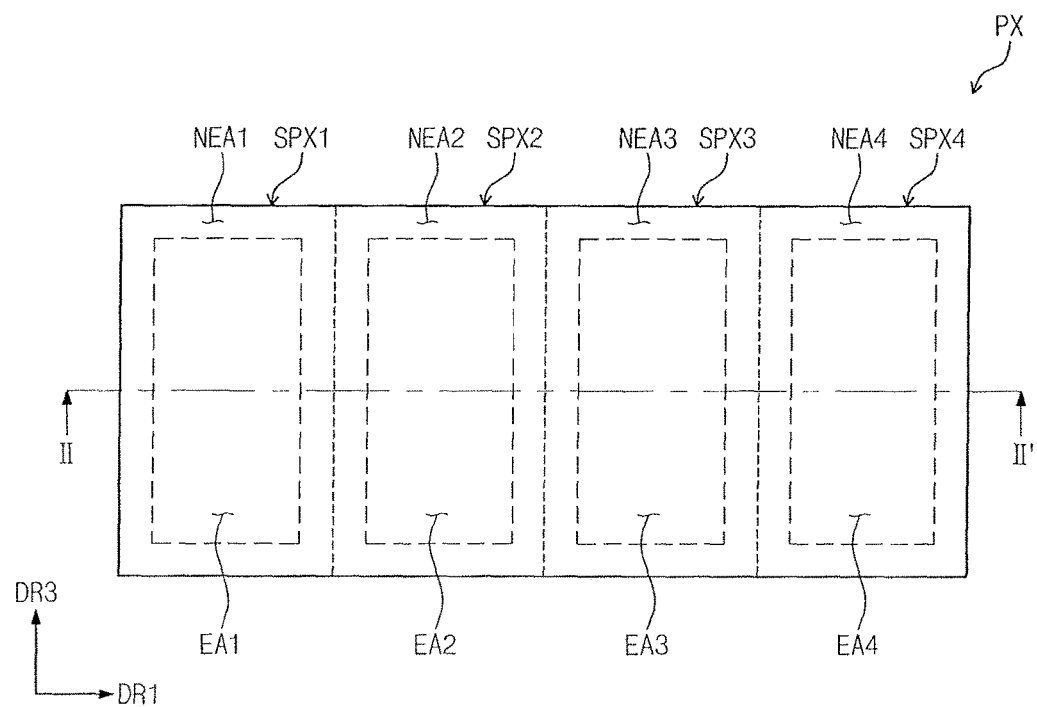
FIG. 5 illustrates another embodiment of sub-pixels.

FIG. 5 illustrates an embodiment of sub-pixels which may be included in the display device 10. Referring to FIGS. 1, 2, 3, 4A to 4C, and 5, each pixel PX includes the sub-pixels SPX, e.g., each pixel PX includes the first sub-pixel SPX1, the second sub-pixel SPX2, the third sub-pixel SPX3, and the fourth sub-pixel SPX4. Each sub-pixel SPX includes the light emitting area and the non-light emitting area.

In FIG. 5, the first sub-pixel SPX1, the second sub-pixel SPX2, the third sub-pixel SPX3, and the fourth sub-pixel SPX4 are sequentially connected in the first direction DR1 when viewed in a plan view. In one embodiment, the first sub-pixel SPX1, the second sub-pixel SPX2, the third sub-pixel SPX3, and the fourth sub-pixel SPX4 may be sequentially connected in the third direction DR3 when viewed in a plan view. In one embodiment, the first sub-pixel SPX1, the third sub-pixel SPX3, the second sub-pixel SPX2, and the fourth sub-pixel SPX4 may be sequentially connected in the first direction DR1 when viewed in a plan view.

In addition, the first sub-pixel SPX1, the second sub-pixel SPX2, the third sub-pixel SPX3, and the fourth sub-pixel SPX4 may have substantially the same shape and the same size when viewed in a plan view as shown in FIG. 5. In one embodiment, when viewed in a plan view, the shape or size of any one of the first sub-pixel SPX1, the second sub-pixel SPX2, the third sub-pixel SPX3, and the fourth sub-pixel SPX4 may be different from that of the others in each pixel PX.

Further, each of the first sub-pixel SPX1, the second sub-pixel SPX2, the third sub-pixel SPX3, and the fourth sub-pixel SPX4 may have substantially a rectangular shape as shown in FIG. 5. In one embodiment, each of the pixels, the first sub-pixel SPX1, the second sub-pixel SPX2, the third sub-pixel SPX3, and the fourth sub-pixel SPX4 may have at least one shape of a circular shape, an oval shape, a square shape, a parallelogram, a trapezoid shape, or a lozenge shape when viewed in a plan view. In addition, each of the pixels, the first sub-pixel SPX1, the second sub-pixel SPX2, the third sub-pixel SPX3, and the fourth sub-pixel SPX4 may have a quadrangular shape in which at least one corner of the quadrangular shape is rounded.

FIGS. 6A to 6D illustrate various embodiments of light emitting areas that may be included in the display device 10. In these embodiments, each of the first, second, third, and fourth light emitting areas EA1, EA2, EA3, and EA4 is illustrated to have substantially a rectangular shape when viewed in a plan view, as in FIG. 5. However, the first, second, third, and fourth light emitting areas EA1, EA2, EA3, and EA4 may have a different shape or may have shapes different from one another.

For example, each of the first, second, third, and fourth light emitting areas EA1, EA2, EA3, and EA4 may have at least one of a circular shape, an oval shape, a square shape, a parallelogram, a trapezoid shape, or a lozenge shape when viewed in a plan view. In addition, each of the second, third, and fourth light emitting areas EA2, EA3, and EA4 may have the quadrangular shape in which at least one corner thereof is rounded.

Referring to FIG. 5, the first, second, third, and fourth light emitting areas EA1, EA2, EA3, and EA4 may be sequentially arranged in the first direction DR1 and spaced apart from each other when viewed in a plan view. Each of the first, second, third, and fourth light emitting areas EA1, EA2, EA3, and EA4 may have a rectangular shape having a length in the third direction DR3 longer than a length in the first direction DR1 when viewed in a plan view.

Figure 6A:
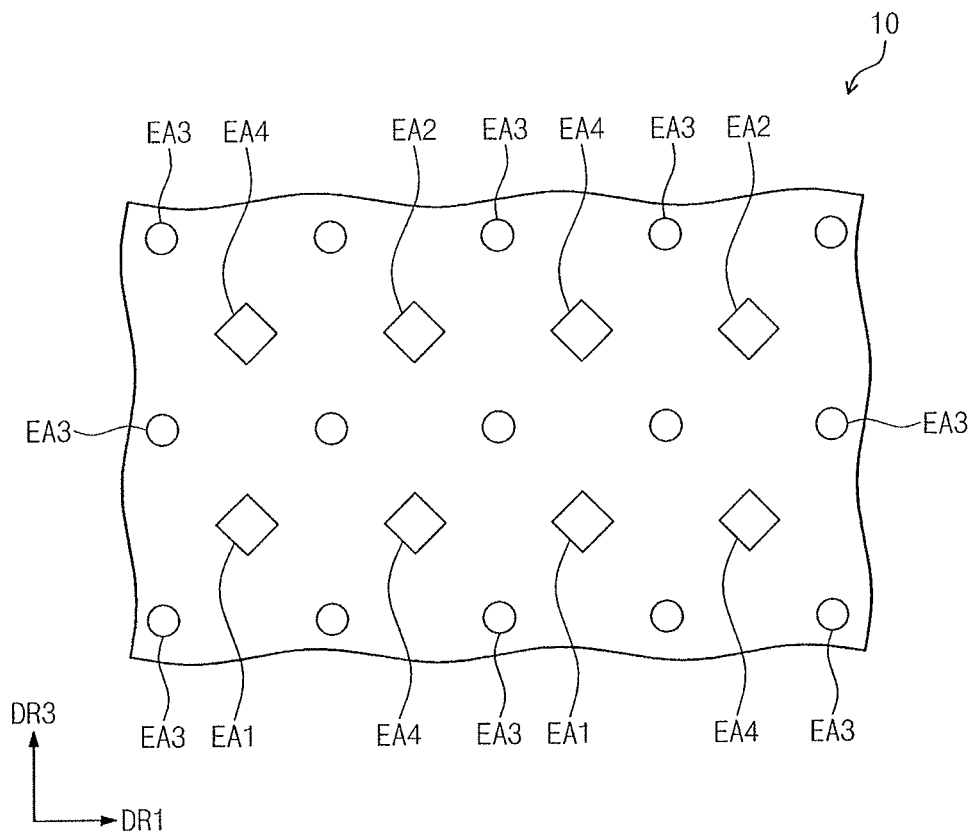
FIGS. 6A to 6D illustrate examples of light emitting areas.

In one embodiment, the first, second, third, and fourth light emitting areas EA1, EA2, EA3, and EA4 may have a variety of shapes when viewed in a plan view as shown in FIGS. 6A to 6D. Referring to FIG. 6A, a plurality of third light emitting areas EA3 may be provided, and each of the third light emitting areas EA3 may have a circular shape when viewed in a plan view. The third light emitting areas EA3 are arranged spaced apart from each other in the first and third directions DR1 and DR3. When viewed in a plan view, the first light emitting area EA1, the second light emitting area EA2, or the fourth light emitting area EA4 may be between four third light emitting areas EA3.

Figure 6B:
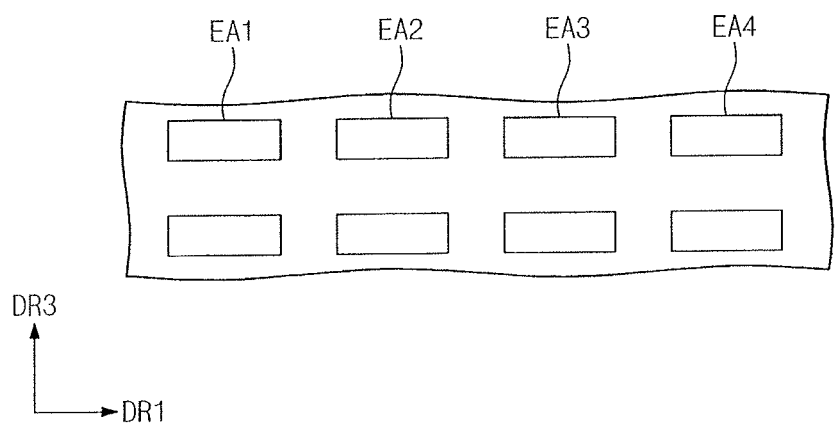

Referring to FIG. 6B, the first, second, third, and fourth light emitting areas EA1, EA2, EA3, and EA4 are sequentially arranged in the first direction DR1 and spaced apart from each other. In addition, each of the first, second, third, and fourth light emitting areas EA1, EA2, EA3, and EA4 has a rectangular shape, in which the length in the first direction DR1 is longer than the length in the third direction DR3 when viewed in a plan view.

Figure 6C:
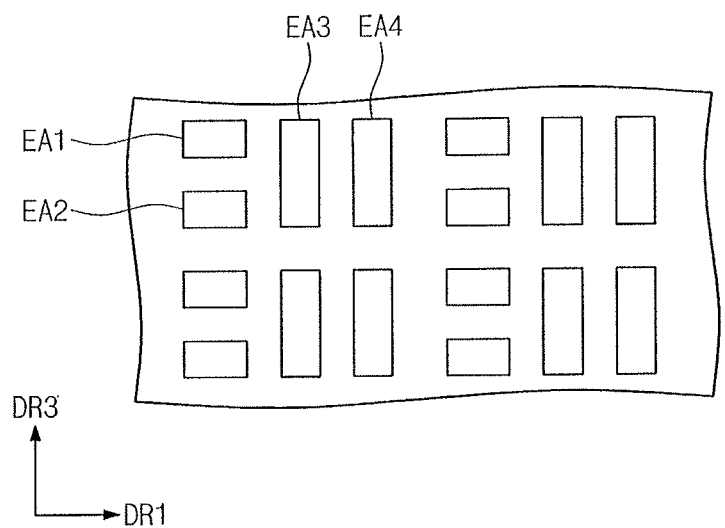

Referring to FIG. 6C, when viewed in a plan view, the first and second light emitting areas EA1 and EA2 are arranged in the third direction DR3 and spaced apart from each other. The third and fourth light emitting areas EA3 and EA4 are arranged in the first direction DR1 and spaced apart from each other. Each of the first and second light emitting areas EA1 and EA2 has a rectangular shape, in which the length in the first direction DR1 is longer than the length in the third direction DR3. Each of the third and fourth light emitting areas EA3 and EA4 has a rectangular shape, in which the length in the third direction DR3 is longer than the length in the first direction DR1.

Figure 6D:
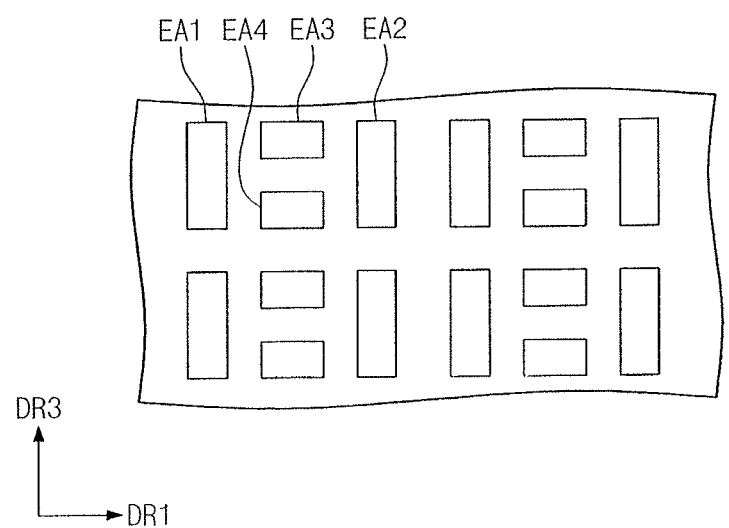

Referring to FIG. 6D, when viewed in a plan view, the first and second light emitting areas EA1 and EA2 are arranged in the first direction DR1 and spaced apart from each other. The third and fourth light emitting areas EA3 and EA4 are arranged between the first and second light emitting areas EA1 and EA2. The third and fourth light emitting areas EA3 and EA4 are arranged in the third direction DR3 and spaced apart from each other. Each of the first and second light emitting areas EA1 and EA2 has a rectangular shape, in which the length in the third direction DR3 is longer than the length in the first direction DR1. Each of the third and fourth light emitting areas EA3 and EA4 has a rectangular shape, in which the length in the first direction DR1 is longer than the length in the third direction DR3.

FIGS. 6A to 6D illustrate the arrangements of the first, second, third, and fourth light emitting areas EA1, EA2, EA3, and EA4 and the shape of the first, second, third, and fourth light emitting areas EA1, EA2, EA3, and EA4 when viewed in a plan view. The first, second, third, and fourth light emitting areas EA1, EA2, EA3, and EA4 may be arranged in different ways and/or may have different shapes in other embodiments.

Referring again to FIGS. 1, 2, 3, 4A to 4C, and 5, the first sub-pixel SPX1 includes a first sub-thin film transistor, the first sub-organic light emitting device S_OEL1, and a first capacitor. The first sub-organic light emitting device S_OEL1 is connected to the first sub-thin film transistor. The first sub-organic light emitting device S_OEL1 emits light in the wavelength range of about 440 nm to about 458 nm. The first sub-organic light emitting device S_OEL1 emits deep blue light. The first sub-organic light emitting device S_OEL1 includes the first anode AN1, the first common light emitting portion CMLP1, the first sub-light emitting portion SMLP1, and the first cathode portion CATP1 sequentially stacked in the second direction DR2 crossing the first direction DR1. The first sub-organic light emitting device S_OEL1 further includes the first hole transport region portion HTRP1, the first intermediate auxiliary portion IMLP1, and the first electron transport region portion ETRP1. The first capacitor is connected to the first sub-thin film transistor.

The first sub-pixel SPX1 includes the first light emitting area EA1 and the first non-light emitting area NEA1. The first light emitting area EA1 emits deep blue light in the wavelength range of about 440 nm to about 458 nm. When viewed in a plan view, the first light emitting area EA1 has one of a circular shape, square shape, rectangular shape, or lozenge shape. The first light emitting area EA1 may have the quadrangular shape in which at least one corner thereof is rounded. The first non-light emitting area NEA1 does not emit the light. When viewed in a plan view, the first non-light emitting area NEA1 may surround the first light emitting area EA1.

The second sub-pixel SPX2 includes a second sub-thin film transistor, the second sub-organic light emitting device S_OEL2, and a second capacitor. The second sub-organic light emitting device S_OEL2 is connected to the second sub-thin film transistor and emits light in the wavelength range of about 459 nm to about 490 nm. Thus, the second sub-organic light emitting device S_OEL2 emits sky blue light.

The second sub-organic light emitting device S_OEL2 includes the second anode AN2, the second common light emitting portion CMLP2, the first auxiliary layer AL1, the second sub-light emitting portion SMLP2, and the second cathode portion CATP2. The second anode AN2, the second common light emitting portion CMLP2, the first auxiliary layer AL1, the second sub-light emitting portion SMLP2, and the second cathode portion CATP2 are sequentially stacked in the second direction DR2. In one embodiment, the aforementioned features may be stacked in order of the second anode AN2, the second common light emitting portion CMLP2, the second sub-light emitting portion SMLP2, the first auxiliary layer AL1, and the second cathode portion CATP2. The second sub-organic light emitting device S_OEL2 further includes the second hole transport region portion HTRP2, the second intermediate auxiliary portion IMLP2, and the second electron transport region portion ETRP2. The second capacitor is connected to the second sub-thin film transistor.

The second sub-pixel SPX2 includes the second light emitting area EA2 and the second non-light emitting area NEA2. The second light emitting area EA2 emits sky blue light in the wavelength range of about 459 nm to about 490 nm. When viewed in a plan view, the second light emitting area EA2 has one of a circular shape, square shape, rectangular shape, and a lozenge shape. The second light emitting area EA2 may have the quadrangular shape in which at least one corner thereof is rounded. The second non-light emitting area NEA2 does not emit the light. When viewed in a plan view, the second non-light emitting area NEA2 may surround the second light emitting area EA2.

The third sub-pixel SPX3 includes a third sub-thin film transistor, the third sub-organic light emitting device S_OEL3, and a third capacitor. The third sub-organic light emitting device S_OEL3 is connected to the third sub-thin film transistor. The third sub-organic light emitting device S_OEL3 emits light in the wavelength range of about 495 nm to about 570 nm. The third sub-organic light emitting device S_OEL3 emits green light. he third sub-organic light emitting device S_OEL3 includes the third anode AN3, the third common light emitting portion CMLP3, and the third cathode portion CATP3, which are sequentially stacked in the second direction DR2. The third sub-organic light emitting device S_OEL3 further includes the third hole transport region portion HTRP3 and the third electron transport region portion ETRP3. The third capacitor is connected to the third sub-thin film transistor.

The third sub-pixel SPX3 includes the third light emitting area EA3 and the third non-light emitting area NEA3. The third light emitting area EA3 emits green light in the wavelength range of about 495 nm to about 570 nm. When viewed in a plan view, the third light emitting area EA3 has one of a circular shape, square shape, rectangular shape, or lozenge shape. The third light emitting area EA3 may have a quadrangular shape in which at least one corner thereof is rounded. The third non-light emitting area NEA3 does not emit the light. When viewed in a plan view, the third non-light emitting area NEA3 may surround the third light emitting area EA3.

The fourth sub-pixel SPX4 includes a fourth sub-thin film transistor, the fourth sub-organic light emitting device S_OEL4, and a fourth capacitor. The fourth sub-organic light emitting device S_OEL4 is connected to the fourth sub-thin film transistor. The fourth sub-organic light emitting device S_OEL4 emits light in the wavelength range of about 620 nm to about 750 nm. The fourth sub-organic light emitting device S_OEL4 emits red light. The fourth sub-organic light emitting device S_OEL4 includes the fourth anode AN4, the fourth common light emitting portion CMLP4, the light emitting layer EML1, and the fourth cathode portion CATP4, which are sequentially stacked in the second direction DR2.

The fourth sub-organic light emitting device S_OEL4 further includes the fourth hole transport region portion HTRP4, the second auxiliary layer AL2, and the fourth electron transport region portion ETRP4. The second auxiliary layer AL2 is between the fourth common light emitting portion CMLP4 and the light emitting layer EML1 or between the light emitting layer EML and the fourth cathode portion CATP4. The fourth capacitor is connected to the fourth sub-thin film transistor.

The fourth sub-pixel SPX4 includes the fourth light emitting area EA4 and the fourth non-light emitting area NEA4. The fourth light emitting area EA4 emits red light in the wavelength range of about 620 nm to about 750 nm. When viewed in a plan view, the fourth light emitting area EA4 has one of a circular shape, square shape, rectangular shape, or lozenge shape. The fourth light emitting area EA4 may have a quadrangular shape in which at least one corner thereof is rounded. The fourth non-light emitting area NEA4 does not emit the light. When viewed in a plan view, the fourth non-light emitting area NEA4 may surround the fourth light emitting area EA4.

Figure 7A:
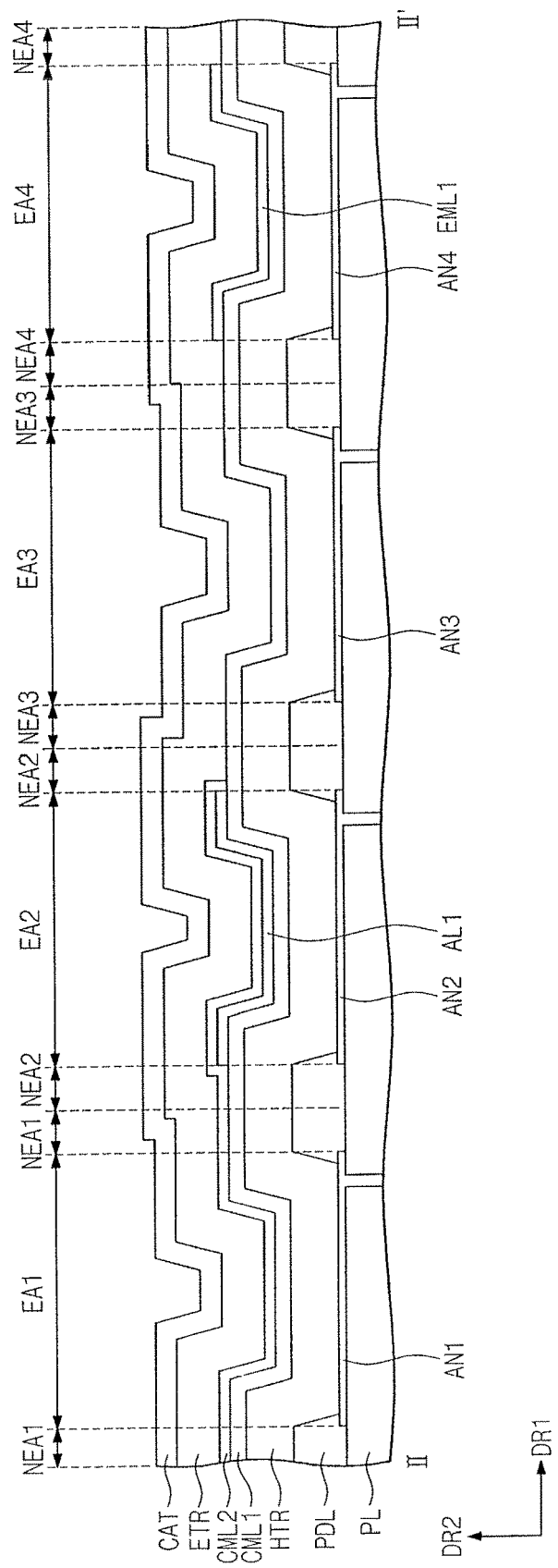
FIG. 7A illustrates a view along section line II-II' and FIG. 7B illustrates a view along section line II-II' in FIG. 5.
Figure 7B:
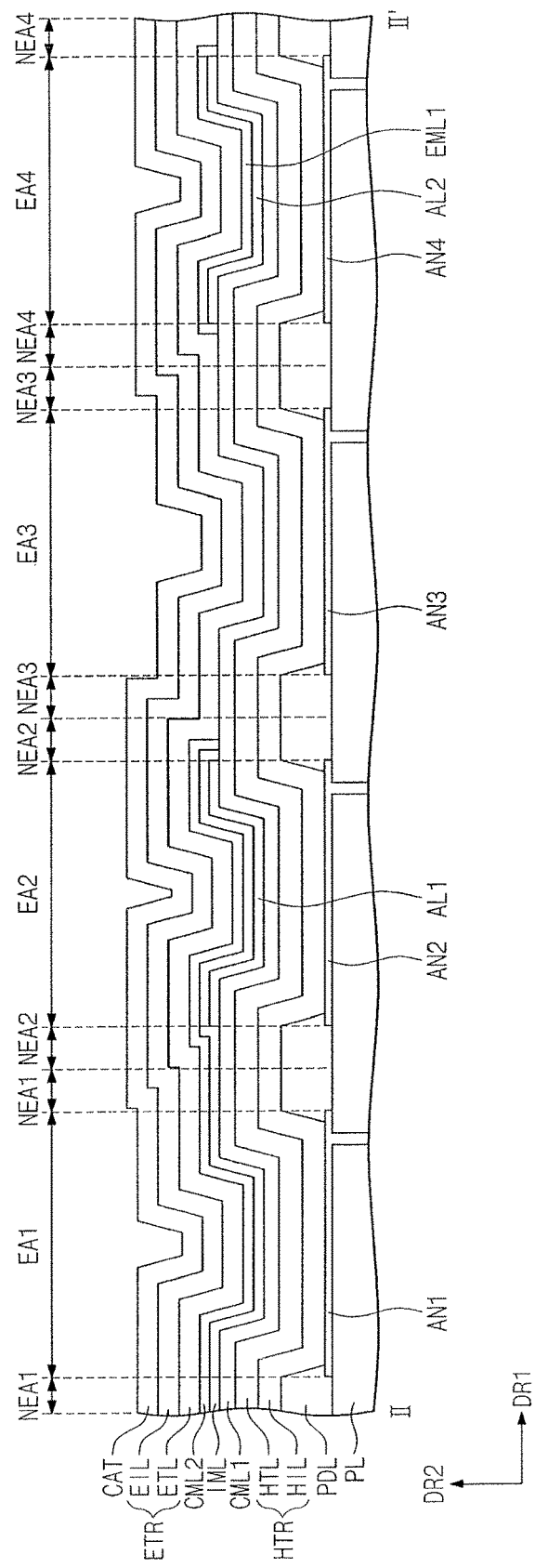

FIGS. 7A and 7B are cross-sectional views taken along line II-II' in FIG. 5. Referring to FIGS. 1, 2, 5, 7A, and 7B, the display device includes the anodes AN1, AN2, AN3, and AN4, a pixel definition layer PDL, the hole transport region HTR, the first common light emitting layer CML1, the second common light emitting layer CML2, the light emitting layer EML1, the electron transport region ETR, and the cathode CAT.

The first anode AN1, the second anode AN2, the third anode AN3, and the fourth anode AN4 are on the passivation layer PL. The first anode AN1 is in the first light emitting area EA1. The second anode AN2 is in the second light emitting area EA2. The third anode AN3 is in the third light emitting area EA3. The fourth anode AN4 is in the fourth light emitting area EA4.

The pixel definition layer PDL is on the passivation layer PDL to partition the first light emitting area EA1, the second light emitting area EA2, the third light emitting area EA3, and the fourth light emitting areas EA4. The pixel definition layer PDL exposes an upper surface of each of the first anode AN1, the second anode AN2, the third anode AN3, and the fourth anode AN4. The pixel definition layer PDL includes a metal-fluoride ionic compound. For instance, the pixel definition layer PDL includes the metal-fluoride ionic compound of one of LiF, BaF2, or CsF. When the metal-fluoride ionic compound has a predetermined thickness, the metal-fluoride ionic compound may have an insulating property. The pixel definition layer PDL may have a thickness, for example, of about 10 nm to about 100 nm.

The hole transport region HTR is on the pixel definition layer PDL, the first anode AN1, the second anode AN2, the third anode AN3, and the fourth anode AN4. The hole transport region HTR is provided to an entire surface of the base surface BS (refer, e.g., to FIG. 4C). The hole transport region HTR is in the first light emitting area EA1, the first non-light emitting area NEA1, the second light emitting area EA2, the second non-light emitting area NEA2, the third light emitting area EA3, the third non-light emitting area NEA3, the fourth light emitting area EA4, and the fourth non-light emitting area NEA4 and may be integrally formed as a single unit.

As described above, the hole transport region HTR includes the first hole transport region portion HTRP1, the second hole transport region portion HTRP2, the third hole transport region portion HTRP3, the fourth hole transport region portion HTRP4, the fifth hole transport region portion HTRP5, the sixth hole transport region portion HTRP6, and the seventh hole transport region portion HTRP7. The first hole transport region portion HTRP1 is in the first light emitting area EA1. The second hole transport region portion HTRP2 is in the second light emitting area EA2. The third hole transport region portion HTRP3 is in the third light emitting area EA3. The fourth hole transport region portion HTRP4 is in the fourth light emitting area EA4. The fifth hole transport region portion HTRP5 is in the first and second non-light emitting areas NEA1 and NEA2. The sixth hole transport region portion HTRP6 is in the second and third non-light emitting areas NEA2 and NEA3. The seventh hole transport region portion HTRP7 is in the third and fourth non-light emitting areas NEA3 and NEA4.

The hole transport region HTR includes the hole injection layer HIL and the hole transport layer HTL. The hole injection layer HIL includes the first hole injection portion HILP1, the second hole injection portion HILP2, the third hole injection portion HILP3, the fourth hole injection portion HILP4, the fifth hole injection portion HILP5, the sixth hole injection portion HILP6, and the seventh hole injection portion HILP7. The first hole injection portion HILP1 is in the first light emitting area EA1. The second hole injection portion HILP2 is in the second light emitting area EA2. The third hole injection portion HILP3 is in the third light emitting area EA3. The fourth hole injection portion HILP4 is in the fourth light emitting area EA4. The fifth hole injection portion HILP5 is in the first and second non-light emitting areas NEA1 and NEA2. The sixth hole injection portion HILP6 is in the second and third non-light emitting areas NEA2 and NEA3. The seventh hole injection portion HILP7 is in the third and fourth non-light emitting areas NEA3 and NEA4.

The hole transport layer HTL includes the first hole transport portion HTLP1, the second hole transport portion HTLP2, the third hole transport portion HTLP3, the fourth hole transport portion HTLP4, the fifth hole transport portion HTLP5, the sixth hole transport portion HTLP6, and the seventh hole transport portion HTLP7. The first hole transport portion HTLP1 is in the first light emitting area EA1. The second hole transport portion HTLP2 is in the second light emitting area EA2. The third hole transport portion HTLP3 is in the third light emitting area EA3. The fourth hole transport portion HTLP4 is in the fourth light emitting area EA4. The fifth hole transport portion HTLP5 is in the first and second non-light emitting areas NEA1 and NEA2. The sixth hole transport portion HTLP6 is in the second and third non-light emitting areas NEA2 and NEA3. The seventh hole transport portion HTLP7 is in the third and fourth non-light emitting areas NEA3 and NEA4.

The first common light emitting layer CML1 is on the hole transport region HTR. The first common light emitting layer CML1 includes the first common light emitting portion CMLP1, the second common light emitting portion CMLP2, the third common light emitting portion CMLP3, the fourth common light emitting portion CMLP4, the fifth common light emitting portion CMLP5, the sixth common light emitting portion CMLP6, and the seventh common light emitting portion CMLP1. The first common light emitting portion CMLP1 is in the first light emitting area EA1. The second common light emitting portion CMLP2 is in the second light emitting area EA2. The third common light emitting portion CMLP3 is in the third light emitting area EA3. The fourth common light emitting portion CMLP4 is in the fourth light emitting area EA4. The fifth common light emitting portion CMLP5 is in the first and second non-light emitting areas EA1 and EA2. The sixth common light emitting portion CMLP6 is in the second and third non-light emitting areas EA2 and EA3. The seventh common light emitting portion CMLP7 is in the third and fourth non-light emitting areas EA3 and EA4. The first common light emitting layer CML1 emits third light of a wavelength longer than that of at least one of the first or second lights. The third light in a wavelength range of about 495 nm to about 570 nm.

The first auxiliary layer AL1 is on the first common light emitting layer CML1. The first auxiliary layer AL1 is between the first common light emitting layer CML1 and the second common light emitting layer CML2 or on the second common light emitting layer CML2. The first auxiliary layer AL1 is in the second light emitting area EA2.

The second common light emitting layer CML2 is on the first common light emitting layer CML1. The second common light emitting layer CML2 emits second light in the wavelength range of about 440 nm to about 490 nm. The second common light emitting layer CML2 is in the first light emitting area EA1, the first non-light emitting area NEA1, the second light emitting area EA2, and the second non-light emitting area NEA2 and may be integrally formed as a single unit.

As described above, the second common light emitting layer CML2 includes the first sub-light emitting portion SMLP1, the second sub-light emitting portion SMLP2, and the third sub-light emitting portion SMLP3. The first sub-light emitting portion SMLP1 is in the first light emitting area EA1. The second sub-light emitting portion SMLP2 is in the second light emitting area EA2. The third sub-light emitting portion SMLP3 is in the third light emitting area EA3.

Referring to FIG. 7B, the intermediate auxiliary layer IML is between the first and second common light emitting layers CML1 and CML2. The intermediate auxiliary layer IML prevents the holes from being transported to the second common light emitting layer CML2 from the first common light emitting layer CML1. Thus, the intermediate auxiliary layer IML may prevent third light from being emitted from each of the first and second sub-organic light emitting device S_OEL1 and S_OEL2.

As described above, the intermediate auxiliary layer IML includes the first intermediate auxiliary portion IMLP1, the second intermediate auxiliary portion IMLP2, and the third intermediate auxiliary portion IMLP3. The first intermediate auxiliary portion IMLP1 is in the first light emitting area EA1. The second intermediate auxiliary portion IMLP2 is in the second light emitting area EA2. The third intermediate auxiliary portion IMLP3 is in the first and second non-light emitting areas NEA1 and NEA2.

Referring to FIGS. 1, 2, 5, 7A, and 7B again, the light emitting layer EML1 is on the first common light emitting layer CML1. The light emitting layer EML1 is in the fourth light emitting area EA4. The light emitting layer EML1 emits first light in the wavelength range of about 620 nm to about 750 nm.

The intermediate connecting layer may be between the second common light emitting layer CML2 and the electron transport region ETR, between the first common light emitting layer CML1 and the electron transport region ETR, and the light emitting layer EML1 and the electron transport region ETR.

Referring to FIG. 7B, the second auxiliary layer AL2 is on the first common light emitting layer CML1. The second auxiliary layer AL2 is between the first common light emitting layer CML1 and the light emitting layer EML1 or on the light emitting layer EML1. The second auxiliary layer AL2 is in the fourth light emitting area EA4.

Referring to FIGS. 1, 2, 5, 7A, and 7B, the electron transport region ETR is on the first common light emitting layer CML1, the second common light emitting layer CML2, and the light emitting layer EML1. The electron transport region ETR is in the first light emitting area EA1, the first non-light emitting area NEA1, the second light emitting area EA2, the second non-light emitting area NEA2, the third light emitting area EA3, the third non-light emitting area NEA3, the fourth light emitting area EA4, and the fourth non-light emitting area NEA4 and may be provided as a single unit.

As described above, the electron transport region ETR includes the first electron transport region portion ETRP1, the second electron transport region portion ETRP2, the third electron transport region portion ETRP3, the fourth electron transport region portion ETRP4, the fifth electron transport region portion ETRP5, the sixth electron transport region portion ETRP6, and the seventh electron transport region portion ETRP7. The first electron transport region portion ETRP1 is in the first light emitting area EA1. The second electron transport region portion ETRP2 is in the second light emitting area EA2. The third electron transport region portion ETRP3 is in the third light emitting area EA3. The fourth electron transport region portion ETRP4 is in the fourth light emitting area EA4. The fifth electron transport region portion ETRP5 is in the first and second non-light emitting areas NEA1 and NEA2. The sixth electron transport region portion ETRP6 is in the second and third non-light emitting areas NEA2 and NEA3. The seventh electron transport region portion ETRP7 is in the third and fourth non-light emitting areas NEA3 and NEA4.

The electron transport region ETR includes the electron transport layer ETL and the electron injection layer EIL. In one embodiment, the electron transport layer ETL and/or the electron injection layer EIL may be omitted. The electron transport layer ETL includes the first electron transport portion ETLP1, the second electron transport portion ETLP2, the third electron transport portion ETLP3, the fourth electron transport portion ETLP4, the fifth electron transport portion ETLP5, the sixth electron transport portion ETLP6, and the seventh electron transport portion ETLP7. The first electron transport portion ETLP1 is in the first light emitting area EA1. The second electron transport portion ETLP2 is in the second light emitting area EA2. The third electron transport portion ETLP3 is in the third light emitting area EA3. The fourth electron transport portion ETLP4 is in the fourth light emitting area EA4. The fifth electron transport portion ETLP5 is in the first and second non-light emitting areas NEA1 and NEA2. The sixth electron transport portion ETLP6 is in the second and third non-light emitting areas NEA2 and NEA3. The seventh electron transport portion ETLP7 is in the third and fourth non-light emitting areas NEA3 and NEA4.

The electron injection layer EIL includes the first electron injection portion EILP1, the second electron injection portion EILP2, the third electron injection portion EILP3, the fourth electron injection portion EILP4, the fifth electron injection portion EILP5, the sixth electron injection portion EILP6, and the seventh electron injection portion EILP7. The first electron injection portion EILP1 is in the first light emitting area EA1. The second electron injection portion EILP2 is in the second light emitting area EA2. The third electron injection portion EILP3 is in the third light emitting area EA3. The fourth electron injection portion EILP4 is in the fourth light emitting area EA4. The fifth electron injection portion EILP5 is in the first and second non-light emitting areas NEA1 and NEA2. The sixth electron injection portion EILP6 is in the second and third non-light emitting areas NEA2 and NEA3. The seventh electron injection portion EILP7 is in the third and fourth non-light emitting areas NEA3 and NEA4.

The cathode CAT is on the electron transport region ETR. The cathode CAT is in the first light emitting area EA1, the first non-light emitting area NEA1, the second light emitting area EA2, the second non-light emitting area NEA2, the third light emitting area EA3, the third non-light emitting area NEA3, the fourth light emitting area EA4, and the fourth non-light emitting area NEA4 and may be provided as a single unit.

As described above, the cathode CAT includes the first cathode portion CATP1, the second cathode portion CATP2, the third cathode portion CATP3, the fourth cathode portion CATP4, the fifth cathode portion CATP5, the sixth cathode portion CATP6, and the seventh cathode portion CATP7. The first cathode portion CATP1 is in the first light emitting area EA1. The second cathode portion CATP2 is in the second light emitting area EA2. The third cathode portion CATP3 is in the third light emitting area EA3. The fourth cathode portion CATP4 is in the fourth light emitting area EA4. The fifth cathode portion CATP5 is in the first and second non-light emitting areas NEA1 and NEA2. The sixth cathode portion CATP6 is in the second and third non-light emitting areas NEA2 and NEA3. The seventh cathode portion CATP7 is in the third and fourth non-light emitting areas NEA3 and NEA4.

An organic capping layer may be disposed on the cathode CAT. The organic capping layer may be provided as a single unit in the first light emitting area EA1, the first non-light emitting area NEA1, the second light emitting area EA2, the second non-light emitting area NEA2, the third light emitting area EA3, the third non-light emitting area NEA3, the fourth light emitting area EA4, and/or the fourth non-light emitting area NEA4.

The organic capping layer may reflect light emitted from the light emitting layer EML1, the first common light emitting layer CML1, and the second common light emitting layer CML2 to the light emitting layer EML1, the first common light emitting layer CML1, and the second common light emitting layer CML2 using an upper surface of the organic capping layer. The reflected light is amplified in the organic layer due to a resonance effect. Thus, the light efficiency of the display device 10 may be improved. The organic capping layer may prevent the light from being lost in the cathode CAT due to total reflection of the light in the front surface light emitting type organic light emitting device.

The organic capping layer may include, for example, at least one of TPD15(N4,N4,N4',N4'-tetra(biphenyl-4-yl)biphenyl-4,4'-diamine), TCTA(4,4',4"-Tris(carbazol sol-9-yl)triphenylamine), N, N'-bis(naphthalen-1-yl), or α-NPD (N, N'-bis(phenyl)-2,2'-dimethylbenzidine).

A sealing layer may be disposed on the cathode CAT. The sealing layer may be provided as a single unit in the first light emitting area EA1, the first non-light emitting area NEA1, the second light emitting area EA2, the second non-light emitting area NEA2, the third light emitting area EA3, the third non-light emitting area NEA3, the fourth light emitting area EA4, and/or the fourth non-light emitting area NEA4.

The sealing layer may cover the cathode CAT and may include at least one of an organic layer or an inorganic layer. The sealing layer may be, for example, a thin film sealing layer. The sealing layer may protect the organic light emitting device OEL (refer, e.g., to FIG. 1).

In the one type of organic light emitting device, which includes a sub-organic light emitting device emitting sky blue light and a sub-organic light emitting device emitting deep blue light, the light emitting layer emitting the sky blue light is formed through a separate process from a process used to form the light emitting layer emitting the deep blue light. Accordingly, the manufacturing process of the organic light emitting device becomes complex. Also, light emitting efficiency is deteriorated due to foreign substances entering the organic light emitting device when the organic light emitting device is manufactured.

However, according to the present exemplary embodiment, the light emitting layer emitting sky blue light and the light emitting layer emitting deep blue light may be formed through a single process to have a single-layer structure. Therefore, the manufacturing process of the organic light emitting device is simplified. Also, light emitting efficiency is prevented from being deteriorated since the light emitting layers are substantially not exposed to the foreign substances.

Figure 8:
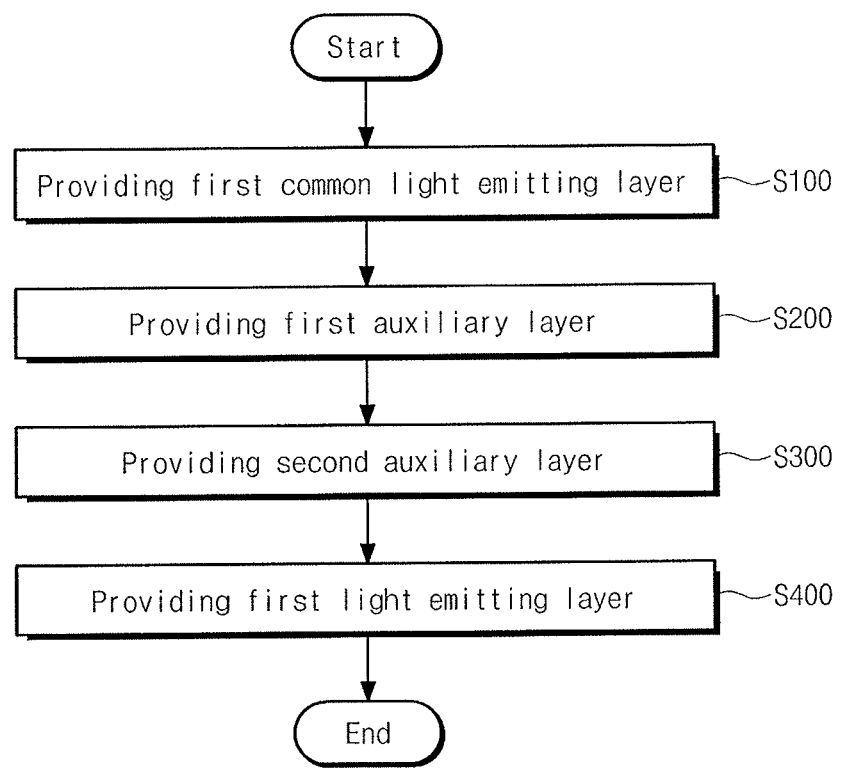
FIG. 8 illustrates an embodiment of a method for manufacturing a display device.

FIG. 8 illustrates an embodiment of a method for manufacturing a display device, which, for example, may be any of the embodiments of the display device previously discussed. FIGS. 9A to 9F are cross-sectional views showing various stages of the method of FIG. 8.

Referring to FIGS. 8 and 9A to 9F, the method includes providing the first common light emitting layer CML1 on a substrate SUB including the first, second, third, and fourth light emitting areas EA1, EA2, EA3, and EA4. The first common light emitting layer CML1 may be placed in the first, second, third, and fourth light emitting areas EA1, EA2, EA3, and EA4 (S100). The method also includes providing the first auxiliary layer AL1 on the first common light emitting layer CML1 using a first mask MSK1, such that the first auxiliary layer AL1 is placed in the second light emitting area EA2 (S200). The method also includes providing the second common light emitting layer CML2 on the first common light emitting layer CML1 and the first auxiliary layer AL1, or between the first common light emitting layer CML1 and the first auxiliary layer AL1, using a second mask MSK2 such that the second common light emitting layer CML2 is placed in the first and second light emitting areas EA1 and EA2 (S300). The method further includes providing the light emitting layer EML on the first common light emitting layer CML1 using a third mask MSK3, such that the light emitting layer EML1 is placed in the fourth light emitting area EA4.

Figure 9A:
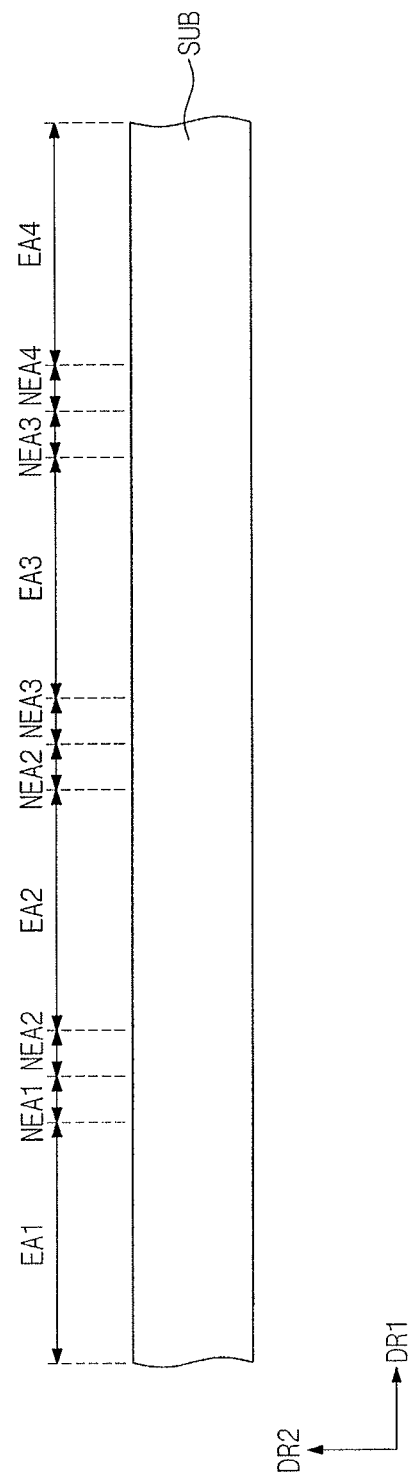

Referring to FIGS. 8 and 9A, the substrate SUB including the first, second, third, and fourth light emitting areas EA1, EA2, EA3, and EA4 is prepared. The first non-light emitting area NEA1 and the second non-light emitting area NEA2 are disposed between the first light emitting area EA1 and the second light emitting area EA2. The second non-light emitting area NEA2 and the third non-light emitting area NEA3 are disposed between the second light emitting area EA2 and the third light emitting area EA3. The third non-light emitting area NEA3 and the fourth non-light emitting area NEA4 are disposed between the third light emitting area EA3 and the fourth light emitting area EA4.

Referring to FIGS. 4C and 8, the substrate SUB includes the base substrate BS, the first semiconductor layer SM1, the second semiconductor layer SM2, the gate insulating layer GI, the first gate electrode GE1, the second gate electrode GE2, the inter-insulating layer IL, the first source electrode SE1, the first drain electrode DE1, the second source electrode SE2, the second drain electrode DE2, the passivation layer PL, the anode AN, and the pixel definition layer PDL (refer to FIG. 7A).

Figure 9B:
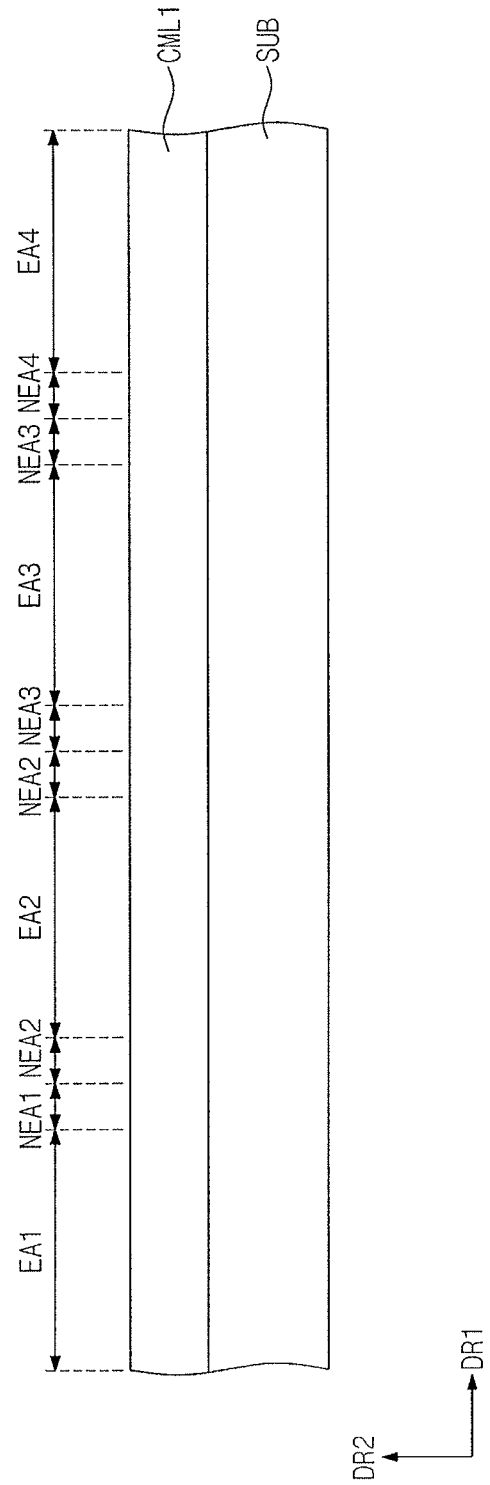

Referring to FIGS. 8 and 9B, the first common light emitting layer CML1 is provided on the substrate SUB (S100). The first common light emitting layer CML1 may be provided to the entire surface of the substrate SUB. The first common light emitting layer CML1 may be provided on the substrate SUB without using a separate mask. The first common light emitting layer CML1 is placed in the first light emitting area EA1, the second light emitting area EA2, the third light emitting area EA3, the fourth light emitting area EA4, the first non-light emitting area NEA1, the second non-light emitting area NEA2, the third non-light emitting area NEA3, and the fourth non-light emitting area NEA4. The first common light emitting layer CML1 emits at least one light in the wavelength range of about 440 nm to about 490 nm, light in the wavelength range of about 495 nm to about 570 nm, or light in the wavelength range of about 620 nm to about 750 nm.

Figure 9C:
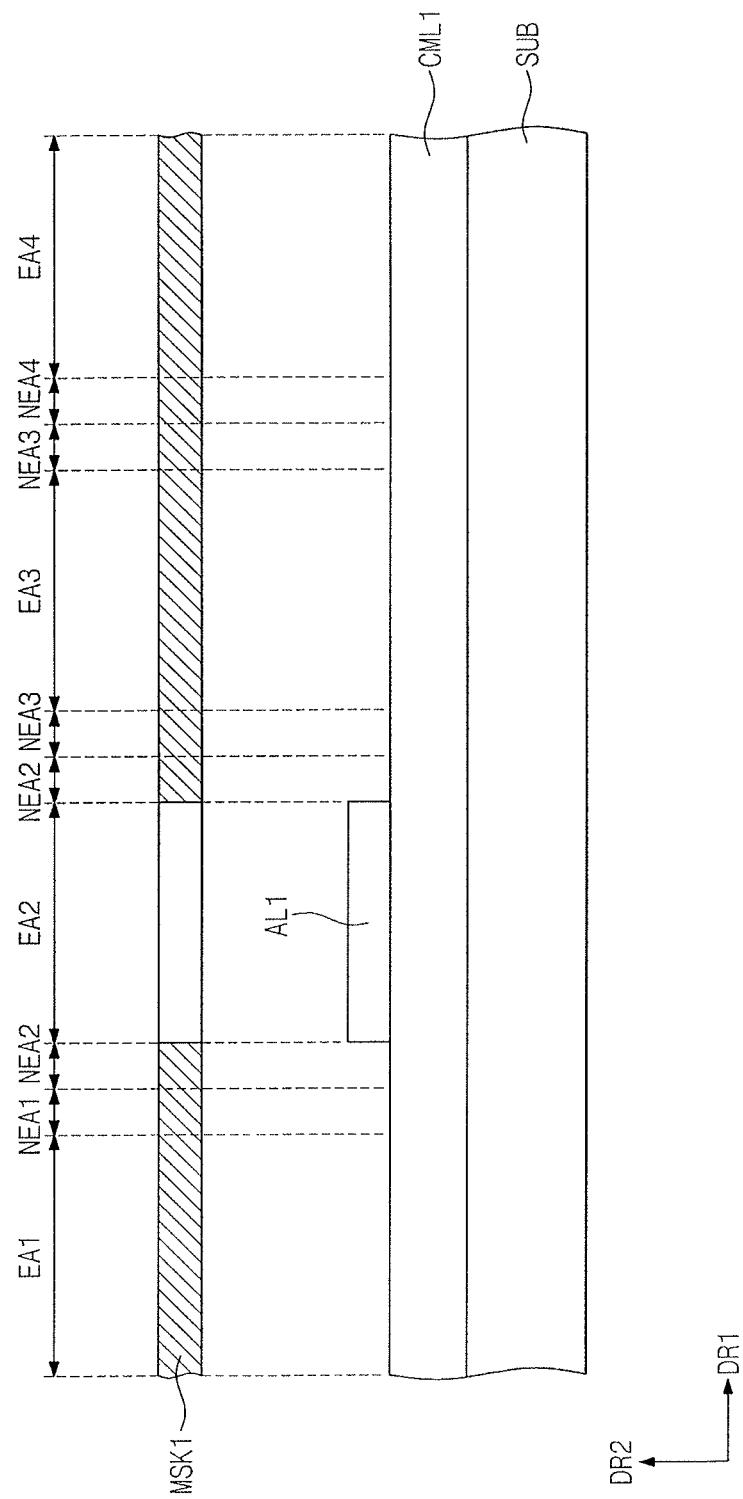

Referring to FIGS. 8 and 9C, the first auxiliary layer AL1 is provided on the first common light emitting layer CML1 using the first mask MSK1 (S200). In one embodiment, the first auxiliary layer AL may be provided on the second common light emitting layer CML2 (refer to FIG. 9D). The first mask MSK1 includes a hole formed therethrough to correspond to the second light emitting area EA2. The first mask MSK1 may be, for example, a fine metal mask. The first auxiliary layer AL1 is placed in the second light emitting area EA2 and is not placed in the first light emitting area EA1, the third light emitting area EA3, and the fourth light emitting area EA4.

Figure 9D:
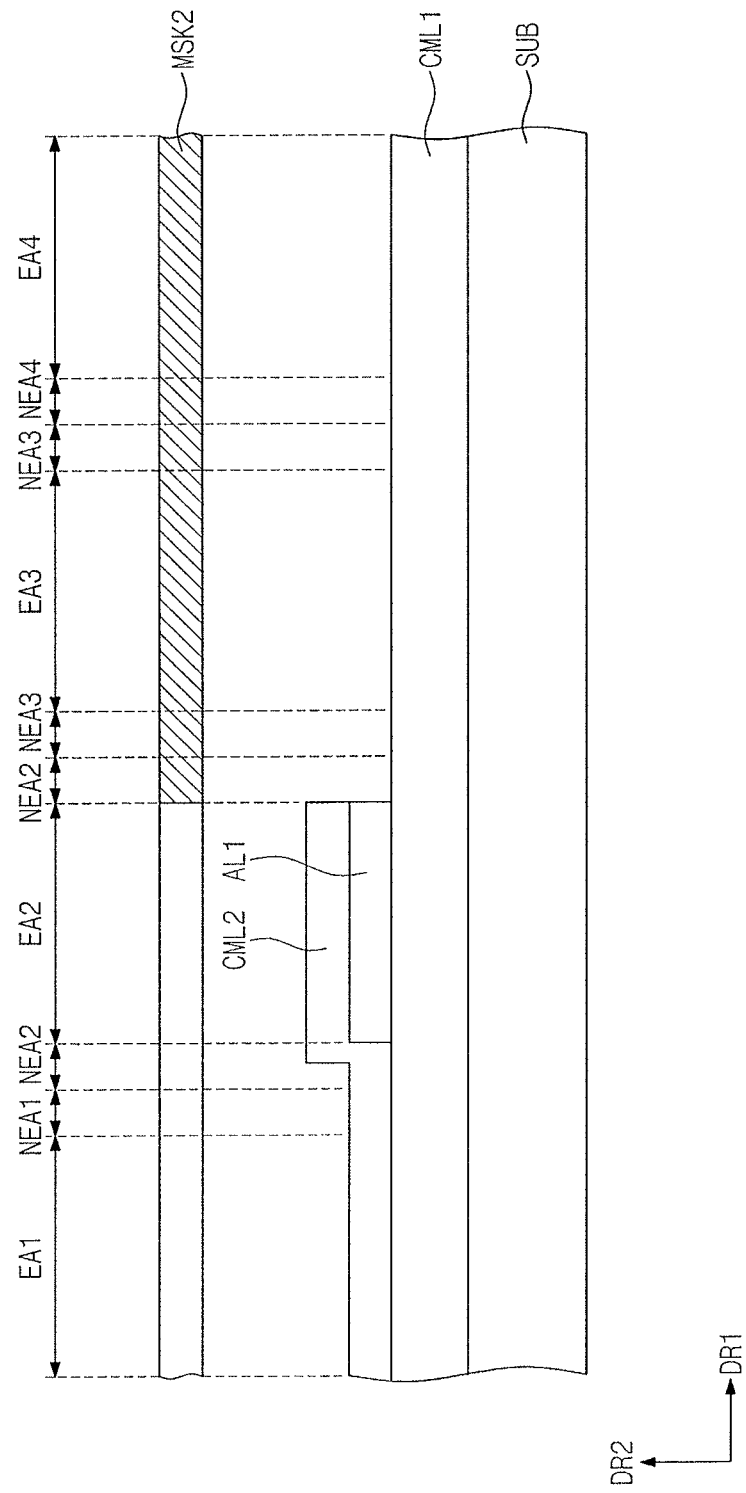

Referring to FIGS. 8 and 9D, the second common light emitting layer CML2 is provided on the first common light emitting layer CML1 and the first auxiliary layer AL1 using the second mask (S300). The second mask MSK2 includes holes formed therethrough to respectively correspond to the first light emitting area EA1 and the second light emitting area EA2. The second mask MSK2 may be, for example, a fine metal mask. The second common light emitting layer CML2 is placed in the first light emitting area EA1, the second light emitting area EA2, the first non-light emitting area NEA1, and the second non-light emitting area NEA2 and may be provided as a single unit. The second common light emitting layer CML2 is not placed in the third light emitting area EA3 and the fourth light emitting area EA4.

The second common light emitting layer CML2 emits light having a wavelength different from that of the first common light emitting layer CML1. For instance, the second common light emitting layer CML2 emits at least one of light in the wavelength range of about 440 nm to about 490 nm, light in the wavelength range of about 495 nm to about 570 nm, or light in the wavelength range of about 620 nm to about 750 nm.

The method may further include providing the intermediate auxiliary layer IML (refer to FIG. 7B) between the first common light emitting layer CML1 and the second common light emitting layer CML2 using the second mask MSK2. The intermediate auxiliary layer IML (refer to FIG. 7B) is placed in the first light emitting area EA1, the second light emitting area EA2, the first non-light emitting area NEA1, and the second non-light emitting area NEA2 and provided in a single unit. The intermediate auxiliary layer IML (refer to FIG. 7B) is not placed in the third light emitting area EA3 and the fourth light emitting area EA4.

Referring to FIGS. 8 and 9E, the method may further include providing the second auxiliary layer AL2 between the first common light emitting layer CML1 and the light emitting layer EML1 using a fourth mask MSK4. The second auxiliary layer AL2 may be provided on the light emitting layer EML. The fourth mask MSK4 includes a hole formed therethrough to correspond to the fourth light emitting area EA4. The second auxiliary layer AL2 is placed in the fourth light emitting area EA4 and not placed in the first light emitting area EA1, the second light emitting area EA2, and the third light emitting area EA3.

Figure 9F:
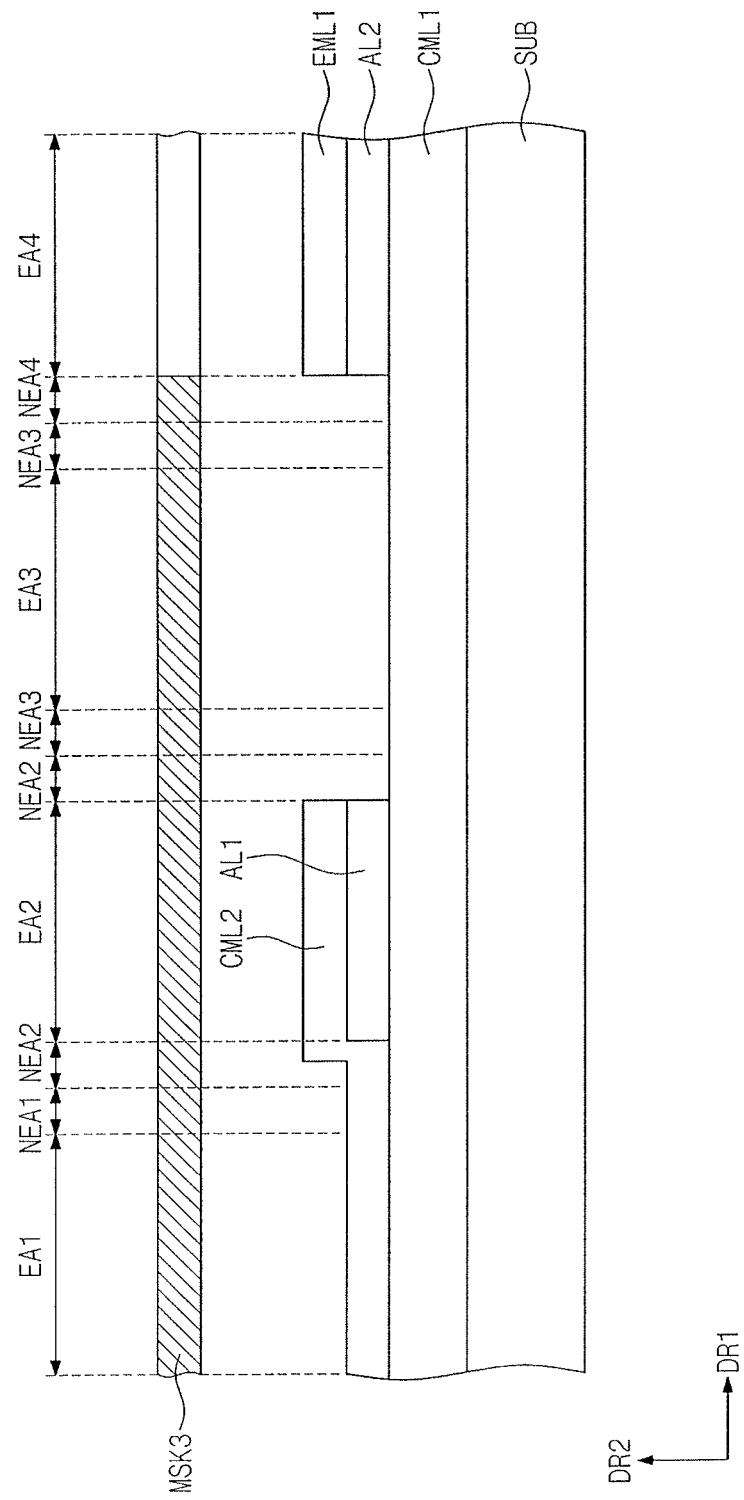

Referring to FIGS. 8 and 9F, the light emitting layer EML is provided on the first common light emitting layer CML1 using the third mask MSK3 (S400). The third mask MSK3 includes a hole formed therethrough to correspond to the fourth light emitting area EA4. The third mask MSK may be, for example, a fine metal mask. The third mask MSK3 may be substantially the same as the fourth mask MSK4. The light emitting layer EML is placed in the fourth light emitting area EA4 and not placed in the first light emitting area EA, the second light emitting area EA2, and the third light emitting area EA3. The light emitting layer EML emits light of a wavelength different from that of each of the first common light emitting layer CML1 and the second common light emitting layer CML2. The light emitting layer EML emits at least one of light in the wavelength range of about 440 nm to about 490 nm, light in the wavelength range of about 495 nm to about 570 nm, and light in the wavelength in the range of about 620 nm to about 750 nm.

In one type of organic light emitting device, which includes the sub-organic light emitting device emitting sky blue light and the sub-organic light emitting device emitting deep blue light, the light emitting layer emitting the sky blue light is formed through a separate process from a process used to form the light emitting layer emitting the deep blue light. Accordingly, the manufacturing process of the organic light emitting device becomes complex. Also, the light emitting efficiency is deteriorated due to foreign substances entering the organic light emitting device when the organic light emitting device is manufactured.

However, according to the present exemplary embodiment, the light emitting layer emitting sky blue light and the light emitting layer emitting deep blue light are formed through a single process to have a single-layer structure. Therefore, the manufacturing process of the organic light emitting device is simplified. Also, the light emitting efficiency is prevented from being deteriorated since the light emitting layers are substantially not exposed to the foreign substances.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the following claims.

What is claimed is:

1. An organic light emitting device, comprising:
   a first sub-organic light emitting device including a first anode, a first common light emitting portion, and a first sub-light emitting portion;
   a second sub-organic light emitting device including a second anode, a second common light emitting portion, a first auxiliary layer, and a second sub-light emitting portion;
   a third sub-organic light emitting device including a third anode and a third common light emitting portion; and
   a fourth sub-organic light emitting device including a fourth anode, a fourth common light emitting portion, and a light emitting layer emitting a first light,
   wherein the first sub-light emitting portion and the second sub-light emitting portion are provided as an integral structure and emit a second light, and wherein the first common light emitting portion, the second common light emitting portion, the third common light emitting portion and fourth common light emitting portion are provided as a integral structure and emit a third light having a wavelength longer than a wavelength of at least one of the first or second lights.

2. The organic light emitting device as claimed in claim 1, wherein:
   the first light is in a wavelength range of about 620 nm to about 750 nm,
   the second light is in a wavelength range of about 440 nm to about 490 nm, and the third light is in a wavelength range of about 495 nm to about 570 nm.

3. The organic light emitting device as claimed in claim 1, wherein:
   the first sub-organic light emitting device emits light in a wavelength range of about 440 nm to about 458 nm,
   the second sub-organic light emitting device emits light in a wavelength range of about 459 nm to about 490 nm,
   the third sub-organic light emitting device emits light in a wavelength range of about 495 nm to about 570 nm, and
   the fourth sub-organic light emitting device emits light in a wavelength range of about 620 nm to about 750 nm.

4. The organic light emitting device as claimed in claim 1, wherein the first auxiliary layer is between the second common light emitting portion and the second sub-light emitting portion or on the second sub-light emitting portion.

5. The organic light emitting device as claimed in claim 1, wherein:
   the fourth sub-organic light emitting device includes a second auxiliary layer, and
   the second auxiliary layer is between the fourth common light emitting portion and the light emitting layer or on the light emitting layer.

6. The organic light emitting device as claimed in claim 1, wherein:
   the first sub-organic light emitting device includes a first intermediate auxiliary portion between the first common light emitting portion and the first sub-light emitting portion,
   the second sub-organic light emitting device includes a second intermediate auxiliary portion between the second common light emitting portion and the first auxiliary layer, and
   the first intermediate auxiliary portion is provided with the second intermediate auxiliary portion in an integral structure.

7. The organic light emitting device as claimed in claim 1, wherein the first sub-organic light emitting device, the second sub-organic light emitting device, and the third sub-organic light emitting device are spaced apart from each other.

* * * * *